United States Patent
Lin et al.

(10) Patent No.: US 9,293,432 B2
(45) Date of Patent: Mar. 22, 2016

(54) METAL CONTACT FOR CHIP PACKAGING STRUCTURE

(71) Applicant: NANTONG FUJITSU MICROELECTRONICS CO., LTD., Nantong, Jiangsu (CN)

(72) Inventors: Chang-Ming Lin, Jiangsu (CN); Lei Shi, Jiangsu (CN); Haijun Shen, Jiangsu (CN)

(73) Assignee: NANTONG FUJITSU MICROELECTRONICS CO., LTD., Jiangsu (CN)

( * ) Notice: Subject to any disclaimer, the term of this patent is extended or adjusted under 35 U.S.C. 154(b) by 0 days.

(21) Appl. No.: 14/441,477

(22) PCT Filed: Oct. 30, 2013

(86) PCT No.: PCT/CN2013/086211
§ 371 (c)(1),
(2) Date: May 7, 2015

(87) PCT Pub. No.: WO2014/071814
PCT Pub. Date: May 15, 2014

(65) Prior Publication Data
US 2015/0294949 A1    Oct. 15, 2015

(30) Foreign Application Priority Data

Nov. 8, 2012  (CN) .......................... 2012 1 0444502
Nov. 8, 2012  (CN) .......................... 2012 1 0444530

(51) Int. Cl.
| | | |
|---|---|---|
| *H01L 23/48* | (2006.01) |
| *H01L 21/00* | (2006.01) |
| *B23K 31/02* | (2006.01) |
| *H01L 23/00* | (2006.01) |
| *H01L 23/498* | (2006.01) |

(52) U.S. Cl.
CPC .......... *H01L 24/13* (2013.01); *H01L 23/49816* (2013.01); *H01L 24/11* (2013.01);
(Continued)

(58) Field of Classification Search
CPC ... H01L 24/13; H01L 23/49816; H01L 24/16; H01L 24/81; H01L 24/29; H01L 24/06; H01L 24/83; H01L 21/11
See application file for complete search history.

(56) References Cited

U.S. PATENT DOCUMENTS 6,137,184 A * 10/2000 Ikegami .............. H01L 21/4853
                                                            257/734
6,518,651 B2    2/2003 Hashimoto
(Continued)

FOREIGN PATENT DOCUMENTS

| CN | 1392607 A | 1/2003 |
| CN | 1630029 A | 6/2005 |

(Continued)

OTHER PUBLICATIONS

International Search Report in Chinese Language issued by the State Intellectual Property Office of the P.R. China, dated Jan. 6, 2014, for International Application No. PCT/CN2013/086210; 4 pages.

(Continued)

*Primary Examiner* — Alonzo Chambliss
(74) *Attorney, Agent, or Firm* — RatnerPrestia

(57) ABSTRACT

A chip packaging structure and packaging method. The packaging structure comprises: a semiconductor substrate; a metal pad provided inside the semiconductor substrate; an insulating layer provided on the semiconductor substrate, the insulating layer having an opening for exposing the metal pad; a sub-ball metal electrode provided on the metal pad; a solder ball provided on the surface of the sub-ball metal electrode, the solder ball having a first apron structure and the first apron structure covering partial metal pad on the periphery of the bottom of the under-ball metal electrode. The chip packaging structure of the present invention enhances the adhesion between the solder ball and the metal pad, and improves the reliability in chip packaging.

16 Claims, 12 Drawing Sheets

(52) U.S. Cl.
CPC .............. *H01L 24/16* (2013.01); *H01L 24/29* (2013.01); *H01L 24/81* (2013.01); *H01L 24/83* (2013.01); *H01L 24/06* (2013.01); *H01L 2224/10125* (2013.01); *H01L 2224/10145* (2013.01); *H01L 2224/11013* (2013.01); *H01L 2224/11825* (2013.01); *H01L 2224/13008* (2013.01); *H01L 2224/13084* (2013.01); *H01L 2224/13099* (2013.01); *H01L 2224/13553* (2013.01); *H01L 2224/13561* (2013.01); *H01L 2224/13599* (2013.01); *H01L 2924/0105* (2013.01); *H01L 2924/01028* (2013.01); *H01L 2924/01047* (2013.01); *H01L 2924/01079* (2013.01); *H01L 2924/35* (2013.01)

(56) References Cited

U.S. PATENT DOCUMENTS

| | | | |
|---|---|---|---|
| 6,780,751 B2* | 8/2004 | Fay | C23F 1/34 257/E21.508 |
| 7,417,311 B2 | 8/2008 | Yamano | |
| 7,554,201 B2* | 6/2009 | Kang | B23K 35/025 257/734 |
| 7,713,860 B2 | 5/2010 | Yu | |
| 7,728,431 B2 | 6/2010 | Harada et al. | |
| 7,932,601 B2 | 4/2011 | Chang et al. | |
| 8,022,530 B2 | 9/2011 | Shih | |
| 8,492,263 B2 | 7/2013 | Wang et al. | |
| 8,492,891 B2 | 7/2013 | Lu et al. | |
| 8,558,379 B2* | 10/2013 | Kwon | H01L 23/49816 257/737 |
| 9,018,758 B2 | 4/2015 | Hwang et al. | |
| 2002/0056741 A1 | 5/2002 | Shieh et al. | |
| 2002/0125569 A1 | 9/2002 | Fukuda et al. | |
| 2003/0234447 A1 | 12/2003 | Yunus | |
| 2005/0167780 A1 | 8/2005 | Edelstein | |
| 2006/0055032 A1* | 3/2006 | Chang | H01L 21/4853 257/734 |
| 2006/0237855 A1 | 10/2006 | Kroehnert | |
| 2006/0246706 A1* | 11/2006 | Ke | H01L 24/11 438/613 |
| 2007/0048896 A1 | 3/2007 | Andry | |
| 2007/0085182 A1 | 4/2007 | Yamaguchi | |
| 2008/0048337 A1 | 2/2008 | Takahashi et al. | |
| 2008/0128904 A1 | 6/2008 | Sakamoto | |
| 2008/0191357 A1 | 8/2008 | Kouno | |
| 2008/0194095 A1 | 8/2008 | Daubenspeck | |
| 2008/0224308 A1 | 9/2008 | Lee | |
| 2009/0072393 A1 | 3/2009 | Bachman | |
| 2009/0098723 A1 | 4/2009 | Yu | |
| 2009/0102050 A1* | 4/2009 | Hsu | H01L 21/4853 257/738 |
| 2009/0110881 A1 | 4/2009 | Daubenspeck | |
| 2009/0200675 A1 | 8/2009 | Goebel | |
| 2009/0256257 A1 | 10/2009 | Daubenspeck | |
| 2009/0309216 A1 | 12/2009 | Jeon | |
| 2010/0187690 A1 | 7/2010 | Okada et al. | |
| 2010/0230811 A1 | 9/2010 | Shin et al. | |
| 2010/0289092 A1 | 11/2010 | Perng | |
| 2011/0101527 A1 | 5/2011 | Cheng | |
| 2011/0115073 A1 | 5/2011 | Chen | |
| 2011/0133333 A1 | 6/2011 | Kwon | |
| 2011/0140126 A1 | 6/2011 | Gaul | |
| 2011/0266670 A1 | 11/2011 | England | |
| 2011/0310579 A1 | 12/2011 | Smeys | |
| 2012/0006591 A1 | 1/2012 | Kaneko | |
| 2012/0006592 A1 | 1/2012 | Ouchi | |
| 2012/0086124 A1 | 4/2012 | Yamaguchi | |
| 2012/0261813 A1 | 10/2012 | Anderson | |
| 2013/0026618 A1 | 1/2013 | Chen | |
| 2013/0026622 A1 | 1/2013 | Chuang | |
| 2013/0049195 A1 | 2/2013 | Wu | |
| 2013/0113097 A1 | 5/2013 | Yu | |
| 2013/0119534 A1 | 5/2013 | Daubenspeck | |
| 2013/0207260 A1 | 8/2013 | Hsu | |
| 2013/0234315 A1 | 9/2013 | Daubenspeck | |
| 2013/0277829 A1 | 10/2013 | Yee | |
| 2013/0292817 A1 | 11/2013 | LaCroix | |
| 2014/0015122 A1 | 1/2014 | Chou | |
| 2014/0042633 A1 | 2/2014 | Hong | |
| 2014/0048926 A1 | 2/2014 | Wang | |
| 2014/0061924 A1 | 3/2014 | Chen | |
| 2014/0077374 A1 | 3/2014 | Lin | |
| 2014/0124897 A1 | 5/2014 | Motoyama | |
| 2014/0252608 A1 | 9/2014 | Chen | |
| 2015/0021759 A1 | 1/2015 | Chen | |
| 2015/0206837 A1 | 7/2015 | Gu | |
| 2015/0206846 A1 | 7/2015 | Lo | |
| 2015/0214127 A1 | 7/2015 | Gu | |
| 2015/0235940 A1 | 8/2015 | Chen | |

FOREIGN PATENT DOCUMENTS

| | | |
|---|---|---|
| CN | 101136383 A | 3/2008 |
| CN | 101154640 A | 4/2008 |
| CN | 101211791 A | 7/2008 |
| CN | 101315915 A | 12/2008 |
| CN | 101436559 A | 5/2009 |
| CN | 101728347 A | 6/2010 |
| CN | 102237316 A | 11/2011 |
| CN | 102270590 A | 12/2011 |
| CN | 102270610 A | 12/2011 |
| CN | 102437065 A | 5/2012 |
| CN | 102437066 A | 5/2012 |
| CN | 102496580 A | 6/2012 |
| CN | 102496604 A | 6/2012 |
| CN | 102664174 A | 9/2012 |
| CN | 102915982 | 2/2013 |
| CN | 102915985 A | 2/2013 |
| CN | 102931098 A | 2/2013 |
| CN | 102931099 A | 2/2013 |
| CN | 102931101 A | 2/2013 |
| CN | 102931110 A | 2/2013 |
| CN | 102931158 A | 2/2013 |
| CN | 102931164 A | 2/2013 |
| CN | 202917475 U | 5/2013 |
| CN | 202917476 U | 5/2013 |
| CN | 202917483 U | 5/2013 |
| CN | 203013710 U | 6/2013 |
| JP | 2004247522 A | 9/2004 |
| JP | 2005136035 A | 5/2005 |
| JP | 2005286087 A | 10/2005 |
| JP | 2006229018 A | 8/2006 |
| JP | 2009224581 A | 10/2009 |
| JP | 201077456 A | 8/2010 |
| JP | 2012054297 A | 3/2012 |
| KR | 20110017153 A | 2/2011 |

OTHER PUBLICATIONS

International Search Report in English Language issued by the State Intellectual Property Office of the P.R. China, dated Jan. 6, 2014, for International Application No. PCT/CN2013/086210; 3 pages.
International Search Report and Written Opinion, in Chinese Language, issued by the State Intellectual Property Office of the P.R. China, dated Jan. 26, 2014, for International Application No. PCT/CN2013/086214; 11 pages.
International Search Report, in English Language, issued by the State Intellectual Property Office of the P.R. China, dated Jan. 26, 2014, for International Application No. PCT/CN2013/086214; 4 pages.
International Search Report and Written Opinion in Chinese Language, issued by the State Intellectual Property Office of the P.R. China, dated Jan. 8, 2014, for International Application No. PCT/CN2013/086211; 10 pages.
International Search Report in English Language, issued by the State Intellectual Property Office of the P.R. China, dated Jan. 8, 2014, for International Application No. PCT/CN2013/086211; 3 pages.
Non Final Office Action for U.S. Appl. No. 14/440,872 dated Dec. 3, 2015.
Non Final Office Action for U.S. Appl. No. 14/440,876 dated Dec. 31, 2015.

* cited by examiner

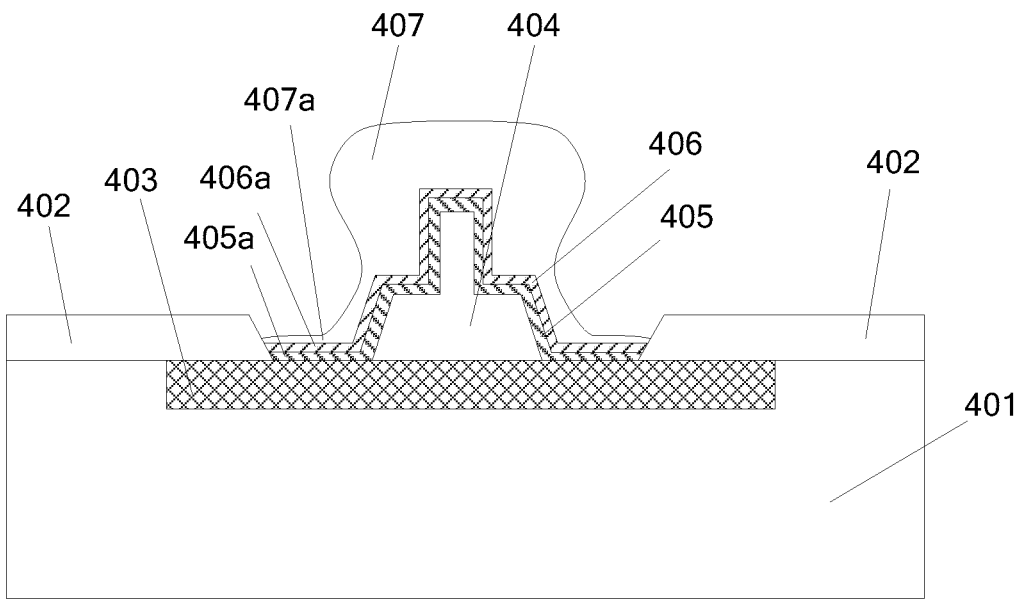

FIG. 11

| a semiconductor substrate is provided, the semiconductor subsTrate having a metal pad and an insulating layer formed thereon, the insulating layer having an opening exposing a surface of the metal pad | S201 |
|---|---|
| a sub-ball metal electrode is formed on the surface of the metal pad | S202 |
| a covering layer is formed on a surface of the sub-ball metal electrode, the covering layer having a second apron structure which covers a portion of the metal pad around the bottom of the sub-ball metal electrode | S203 |
| a solder ball is formed on a surface of the covering layer, the solder ball having a first apron structure which covers the second apron structure | S204 |

METAL CONTACT FOR CHIP PACKAGING STRUCTURE

CROSS-REFERENCE TO RELATED APPLICATIONS

The present application is a Section 371 National Stage Application of International Application No. PCT/CN2013/086211, filed on Oct. 30, 2013, which claims priority to Chinese patent application No. 201210444502.4, filed on Nov. 8, 2012, and entitled "CHIP PACKAGE STRUCTURE", and Chinese patent application No. 201210444530.6, filed on Nov. 8, 2012, and entitled "CHIP PACKAGING METHOD", and the entire disclosures of which are incorporated herein by reference.

FIELD OF THE DISCLOSURE

The present disclosure generally relates to semiconductor technology, and more particularly, to a chip package structure and a chip packaging method.

BACKGROUND OF THE DISCLOSURE

In conventional techniques, Integrated Circuit (IC) chips are connected to external circuits by a wire bonding process. To meet the demand of small feature size of IC chips and the enlargement of a scale of ICs, the wire bonding process is less used. Wafer Level Chip Size Packaging (WLCSP) is a technology in which a whole wafer is packaged and tested, and then diced into individual chips. The size of a packaged chip is almost the same as that of a bare chip. WLCSP technology is totally different from conventional packaging technologies such as Ceramic Leadless Chip Carrier and Organic Leadless Chip Carrier, and satisfies the market requirements for microelectronic products, e.g., light in weight, small in size, thin in thickness and low in cost. Packaging with the WLCSP technology realizes high miniaturization, and the chip cost decreases significantly with the decrease of the chip size and the increase of the wafer size. The WLCSP technology, which, when being implemented, may take into account the IC design, wafer fabrication and packaging test in combination, is currently a focus in the packaging field and becomes one of the development trends of the packaging technologies.

A WLCSP technology is provided in existing techniques. FIG. 1 schematically illustrates a cross-sectional view of an existing WLCSP structure. The WLCSP structure includes: a semiconductor substrate 101; a metal pad 103 inside the semiconductor substrate 101; an insulating layer 102 on a surface of the semiconductor substrate 101; the insulating layer 102 having an opening exposing the metal pad 103; a sub-ball metal electrode 104 formed in the opening and covering a portion of the metal pad 103; a solder ball 105 on the sub-ball metal electrode 104, which covers an upper surface of the sub-ball metal electrode 104.

In the above-described WLCSP structure, a contact area between the solder ball 105 and the sub-ball metal electrode 104 is relatively small, thus, the adhesion between the solder ball 105 and the sub-ball metal electrode 104 is relatively weak. Besides, the solder ball 105 which is generally made of tin directly contacts with the sub-ball metal electrode 104 which is generally made of copper. The tin atoms and copper atoms may diffuse into each other, forming intermetallic compounds and cavities. The intermetallic compounds are fragile, which may affect the mechanical strength and service life of welded points.

Thus, existing chip packaging methods have poor reliability.

More information about chip packaging methods can be found in Chinese patent publication No. CN101211791 which discloses a WLCSP process and a chip package structure.

SUMMARY

In embodiments of the present disclosure, the adhesion between a solder ball and a sub-ball metal electrode may be enhanced, which improves the reliability of a chip package structure.

In an embodiment, a chip package structure is provided. The package structure includes: a semiconductor substrate; a metal pad inside the semiconductor substrate; an insulating layer on the semiconductor substrate, the insulating layer having an opening exposing a first surface of the metal pad; a sub-ball metal electrode disposed on the first surface of the metal pad, wherein the sub-ball metal electrode partially covers the first surface; and a solder ball encompassing the sub-ball metal electrode, wherein the solder ball includes a first portion extending from the bottom part of the sub-ball metal electrode along directions substantially in parallel with the first surface, such that the first portion of the solder ball covers at least a part of the first surface which is not covered by the sub-ball metal electrode.

In some embodiments, the metal pad may include gold, copper, aluminum or silver.

In some embodiments, the metal pad may be a redistributed pad.

In some embodiments, the sub-ball metal electrode may include one selected from gold, copper and silver, or alloy of gold, cooper or silver.

In some embodiments, the sub-ball metal electrode may include a main body and an end portion, wherein the main body is a lower portion of the sub-ball metal electrode which is connected with the metal pad, and the end portion is an upper portion of the sub-ball metal electrode, wherein the projection of the main body on the first surface is larger than the projection of the end portion on the first surface.

In some embodiments, the height of the end portion is 0.005 to 1.5 times to the height of the main body.

In some embodiments, the chip package structure may further include a covering layer disposed between the solder ball and the sub-ball metal electrode, and between the solder ball and the first surface.

In some embodiments, the covering layer may be a stacked structure including an anti-diffusion layer and a wetting layer, wherein the anti-diffusion layer is disposed on the surface of the sub-ball metal electrode and has a third apron structure, and the wetting layer is disposed on a surface of the anti-diffusion layer and has a fourth apron structure.

In some embodiments, the anti-diffusion layer may include nickel.

In some embodiments, the wetting layer may include one selected from tin, gold and silver, or alloy of tin, gold or silver.

In an embodiment, a chip packaging method is provided. The method includes: providing a semiconductor substrate which has a metal pad formed therein and an insulating layer formed thereon, the insulating layer having an opening exposing a first surface of the metal pad; forming a sub-ball metal electrode disposed on the first surface of the metal pad, wherein the sub-ball metal electrode partially covers the first surface; forming a solder ball encompassing the sub-ball metal electrode, wherein the solder ball includes a first portion extending from the bottom part of the sub-ball metal electrode along directions substantially in parallel with the first surface, such that the first portion of the solder ball covers at least a part of the first surface which is not covered by the sub-ball metal electrode.

In some embodiments, the metal pad may include gold, copper, aluminum or silver.

In some embodiments, the metal pad may be a redistributed pad.

In some embodiments, the sub-ball metal electrode may include one selected from gold, copper and silver, or alloy of gold, cooper or silver.

In some embodiments, the sub-ball metal electrode may include a main body and an end portion, wherein the main body is a lower portion of the sub-ball metal electrode which is connected with the metal pad, and the end portion is an upper portion of the sub-ball metal electrode, wherein the projection of the main body on the first surface is larger than the projection of the end portion on the first surface.

In some embodiments, the sub-ball metal electrode may be formed by a wire bonding process, including: bonding a metal wire with the metal pad to form the main body; the metal wire generating an arc portion having a certain height to form the end portion; and cutting the metal wire using a clamp to form the sub-ball metal electrode.

In some embodiments, the height of the end portion is 0.005 to 1.5 times to the height of the main body.

In some embodiments, the method may further include: forming a covering layer between the solder ball and the sub-ball metal electrode, and between the solder ball and the first surface.

In some embodiments, the covering layer may be a stacked structure including an anti-diffusion layer and a wetting layer, wherein the anti-diffusion layer is disposed on the surface of the sub-ball metal electrode, and the wetting layer is disposed on a surface of the anti-diffusion layer.

In some embodiments, the anti-diffusion layer may have a third apron structure, and be formed by a chemical plating process.

Compared with existing techniques, the present disclosure may have following advantages. The solder ball has the first apron structure which covers a portion of the pad around the bottom of the sub-ball metal electrode. The first apron structure increases the contact area between the solder ball and the metal pad, and enhances the adhesion between the solder ball and the metal pad, such that the solder ball is not prone to fall off the metal pad under an external force.

Further, the covering layer includes the anti-diffusion layer and the wetting layer, wherein the anti-diffusion layer is disposed on the surface of the sub-ball metal electrode, and the wetting layer is disposed on the surface of the anti-diffusion layer. In the existing techniques, a solder ball is directly formed on a sub-ball metal electrode, thus, intermetallic compounds and cavities may be formed between the sub-ball metal electrode and the solder ball due to the diffusion of atoms. The intermetallic compounds are fragile, which may affect the mechanical strength and service life of welded points. In embodiments of the present disclosure, the anti-diffusion layer made of nickel is formed on the surface of the sub-ball metal electrode, which can act as a barrier layer between the sub-ball metal electrode and the solder ball to prevent the generation of intermetallic compounds and cavities. Further, the anti-diffusion layer is prone to be oxidized, thus, the wetting layer is formed on the anti-diffusion layer to prevent the oxidization of the anti-diffusion layer. The wetting layer may be infiltrated with the solder ball to be formed to lead to better adhesion. The wetting layer includes one selected from tin, gold and silver, or alloy of gold, cooper or silver. Therefore, the covering layer formed on the sub-ball metal electrode avoids the generation of intermetallic compounds, and improves the reliability of chip packaging. The second apron structure increases the contact area between the covering layer and the metal pad, and enhances the adhesion among the solder ball, the covering layer, the sub-ball metal electrode and the metal pad.

Further, the sub-ball metal electrode include the main body and the end portion, wherein the main body is the lower portion of the sub-ball metal electrode which is connected with the metal pad, and the end portion is the upper portion of the sub-ball metal electrode. The end portion enters into the solder ball, thereby increasing the contact area between the sub-ball metal electrode and the solder ball. In this way, the adhesion between the sub-ball metal electrode and the solder ball is enhanced, when suffering an external force, the solder ball is not prone to fall off the sub-ball metal electrode. Further, the sub-ball metal electrode is formed by a wire bonding process, including: bonding a metal wire with the metal pad to form the main body; the metal wire generating an arc portion having a certain height to form the end portion; and cutting the metal wire using a clamp to form the sub-ball metal electrode. Compared with the existing techniques, the above wire bonding process is simpler and requires lower cost.

BRIEF DESCRIPTION OF THE DRAWINGS

FIG. 11 schematically illustrates a diagram of a chip package structure according to an embodiment of the present disclosure;

FIG. 12 schematically illustrates a diagram of a flow chart of a chip packaging method of the chip package structure in FIG. 11;

DETAILED DESCRIPTION OF THE DISCLOSURE

Figure 1:
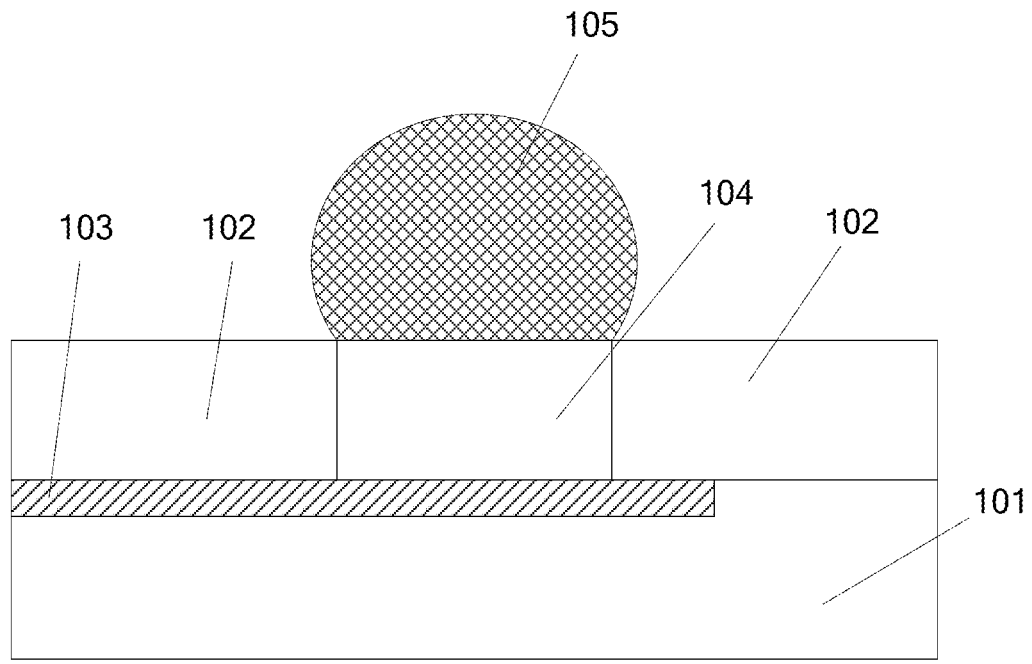
FIG. 1 schematically illustrates a diagram of a chip package structure in the existing techniques.

As described in the background, referring to FIG. 1, the solder ball 105 is disposed on the sub-ball metal electrode 104 and contacts with the upper surface of the sub-ball metal electrode 104. The contact area between the solder ball 105 and the sub-ball metal electrode 104 is relatively small, thus, the adhesion between the solder ball 105 and the sub-ball metal electrode 104 is relatively weak. Besides, when the solder ball 105 which is generally made of tin is formed on the upper surface of the sub-ball metal electrode 104 which is generally made of copper, the tin atoms and copper atoms may diffuse into each other, forming intermetallic compounds and cavities. The intermetallic compounds are fragile, which may affect the mechanical strength and service life of welded points.

In embodiments of present disclosure, a chip package structure and a chip packaging method are provided. The chip package structure includes: a semiconductor substrate; a metal pad inside the semiconductor substrate; an insulating layer on the semiconductor substrate, the insulating layer having an opening exposing the metal pad; a sub-ball metal electrode on the metal pad; and a solder ball on a surface of the sub-ball metal electrode, the solder ball having a first apron structure which covers a portion of the metal pad around the bottom of the sub-ball metal electrode.

In order to clarify the objects, characteristics and advantages of the disclosure, embodiments of present disclosure will be described in detail in conjunction with accompanying drawings. It should be noted that, the drawings as examples are used to help to better understand the embodiments of the present disclosure, but not meant to limit the present disclosure. For convenience, elements in the drawings are not necessarily drawn to scale, may be enlarged, contracted or made with other changes. Details are described below to help to fully understand the present disclosure. However, the present disclosure can be implemented in other ways different from below description. Those skilled in the art can modify and vary the embodiments without departing from the spirit and scope of the present disclosure. Therefore, the present disclosure is not limited by the embodiments disclosed below.

Figure 2:
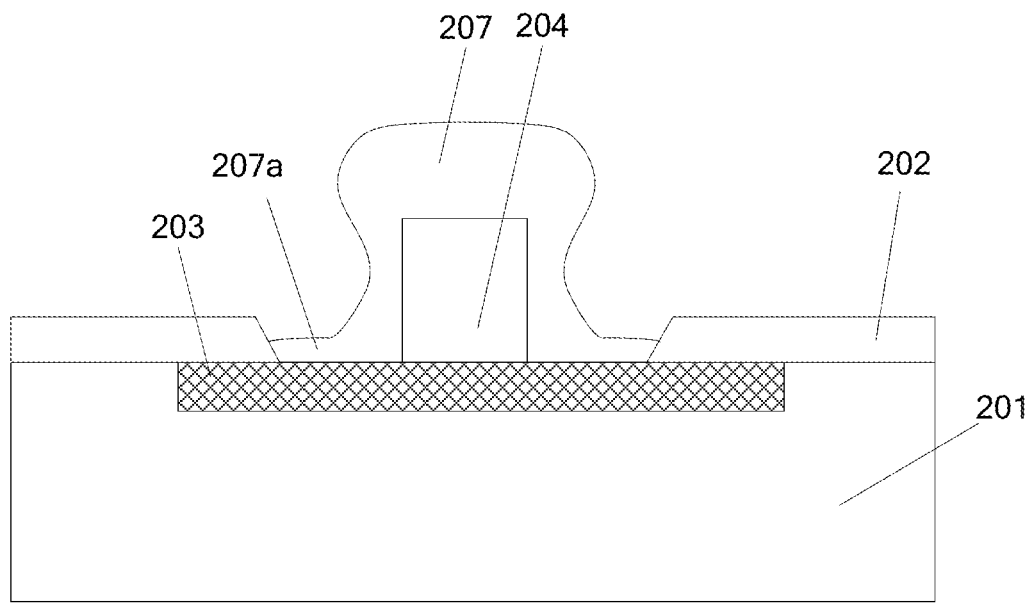
FIG. 2 schematically illustrates a diagram of a chip package structure according to an embodiment of the present disclosure.

FIG. 2 schematically illustrates a diagram of a chip package structure according to an embodiment of the present disclosure. The chip package structure includes: a semiconductor substrate 201; a metal pad 203 inside the semiconductor substrate 201; an insulating layer 202 on the semiconductor substrate 201, the insulating layer 202 having an opening exposing a surface of the metal pad 203; a sub-ball metal electrode 204 on the surface of the metal pad 203; and a solder ball 207 on a surface of the sub-ball metal electrode 204, the solder ball 207 having a first apron structure 207a which covers a portion of the metal pad 203 around the bottom of the sub-ball metal electrode 204.

In some embodiments, the semiconductor substrate 201 may include monocrystalline silicon, Silicon On Insulator (SOI), a wafer of SiGe, or a wafer of compounds of III to V groups. The semiconductor substrate 201 may include a dielectric layer or a plurality of dielectric layers formed inside and on a surface of the semiconductor substrate 201. In some embodiments, the semiconductor substrate 201 may include semiconductor devices, metal interconnects and other semiconductor structures formed thereon.

The metal pad 203 is disposed inside the semiconductor substrate 201 and may be a top interconnect metal electrode of the semiconductor substrate 201. In some embodiments, the metal pad 203 may include gold, copper, aluminum or silver. The metal pad 203, in the chip package structure, is used to connect an inner circuit inside a chip with an external package component.

The insulating layer 202 is disposed on the semiconductor substrate 201, and has an opening exposing the surface of the metal pad 203. In some embodiments, the insulating layer 202 has a passivation layer and a polymer layer (not shown). The passivation layer is adapted to protect the metal pad 203, isolate electrically, and form the opening exposing the surface of the metal pad 203, and may include silicon oxide, silicon nitride or a low-K material. The polymer layer is disposed on the passivation layer, has the opening exposing the surface of the metal pad 203, and may include polyimide, epoxy or benzocyclobutene.

In some embodiments, the semiconductor substrate 201 may include monocrystalline silicon, and further include semiconductor devices, metal interconnects and other semiconductor structures formed thereon. The insulating layer 202 may include a passivation layer of silicon oxide and a polymer layer of polyimide. The insulating lay 202 has an opening exposing the surface of the metal pad 203 which is the top interconnect metal electrode of the semiconductor substrate 201 and includes copper.

In some embodiments, the sub-ball metal electrode 204 may be adapted to connect the metal pad 203 and the solder ball 207. The sub-ball metal electrode 204 may include one of gold, copper and silver, or alloy including gold, copper or silver.

In some embodiments, the sub-ball metal electrode 204 may be formed by: forming a photoresist layer on a surface of the semiconductor substrate 201, the photoresist layer having the opening exposing the surface of the metal pad 203; filling a metal into the opening by an electroplating process, a physical vapor deposition process or an evaporation deposition process; and removing the photoresist layer, the metal forming the sub-ball metal electrode 204.

In some embodiments, the sub-ball metal electrode 204 may be formed by a wire bonding process, including: a metal wire reaching the top of the metal pad 203 by a bonding head; melting the metal wire using oxy-hydrogen flame or electrical sparkle generated by an electrical discharge system; the melted metal solidifying to form a metal ball with a diameter which is 1.5 to 4 times of a diameter of the metal wire under surface tension; dropping the bonding head; pressing the metal ball onto the metal pad 203 under a suitable pressure, temperature and energy at a suitable time, wherein the metal ball is applied with the pressure by the bonding head, and the wire metal and the metal pad 203 is activated to deform plastically and atoms therein may diffuse into each other, to form the sub-ball metal electrode 204; and cutting off the metal wire using a bonding clamp.

The solder ball 207 on the surface of the sub-ball metal electrode 204 has the first apron structure 207a which covers the portion of the metal pad 203 around the bottom of the sub-ball metal electrode 204. The first apron structure 207a may increase the contact area between the solder ball 207 and the metal pad 203, and enhance the adhesion between the solder ball 207 and the metal pad 203, such that the solder ball 207 is not prone to fall off the metal pad 203 under an external force.

From FIG. 2, the solder ball 207 encompasses the sub-ball metal electrode 204, the first apron structure 207a extends from the bottom part of the sub-ball metal electrode 204 along directions substantially in parallel with the surface of the metal pad 203, such that the first apron structure 207a covers at least a part of the surface of the metal pad 203 which is not covered by the sub-ball metal electrode 204. The projection of the first apron structure 207a on the surface of the metal pad 203 is larger than the projection of the other portion of the solder ball 207 on the surface of the metal pad 203.

In some embodiments, the solder ball 207 may be formed by a printing process, and include tin or alloy of tin. In some embodiments, the solder ball 207 may be formed by: printing a soldering paste on the sub-ball metal electrode 204 using a screen; and the soldering paste reflowing under a high temperature and becoming the solder ball 207 under surface tension. As the solder paste infiltrates the sub-ball metal electrode 204 and the metal pad 203, the solder ball 207 may cover the sub-ball metal electrode 204 and the metal pad 203. Thus, the solder ball 207 has the first apron structure 207a covering the portion of the metal pad 203 around the bottom of the sub-ball metal electrode 204. Referring to FIG. 2, due to the above process, the profile curve of the solder ball 207 includes a convex segment and a concave segment from top to bottom.

Figure 3:
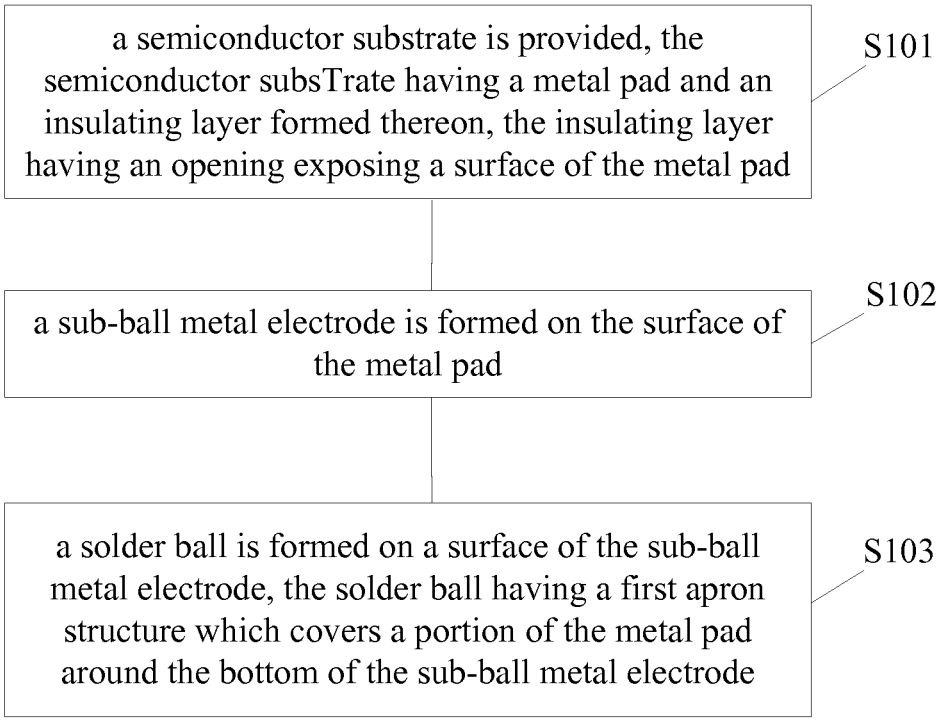
FIG. 3 schematically illustrates a diagram of a flow chart of a chip packaging method of the chip package structure in FIG. 2.

Referring to FIG. 3, FIG. 3 schematically illustrates a diagram of a flow chart of a chip packaging method of the chip package structure in FIG. 2. The method includes S101 to S103.

In S101, a semiconductor substrate is provided, the semiconductor substrate having a metal pad and an insulating layer formed thereon, the insulating layer having an opening exposing a surface of the metal pad.

In S102, a sub-ball metal electrode is formed on the surface of the metal pad.

In S103, a solder ball is formed on a surface of the sub-ball metal electrode, the solder ball having a first apron structure which covers a portion of the metal pad around the bottom of the sub-ball metal electrode.

Figure 4:
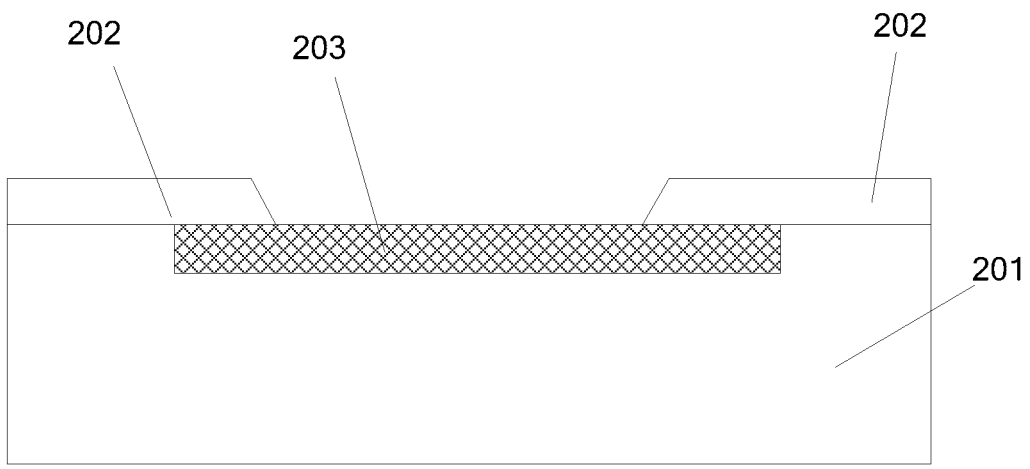
FIGS. 4 to 6 schematically illustrate cross-sectional views of intermediate structures of the method shown in FIG. 4.
Figure 5:
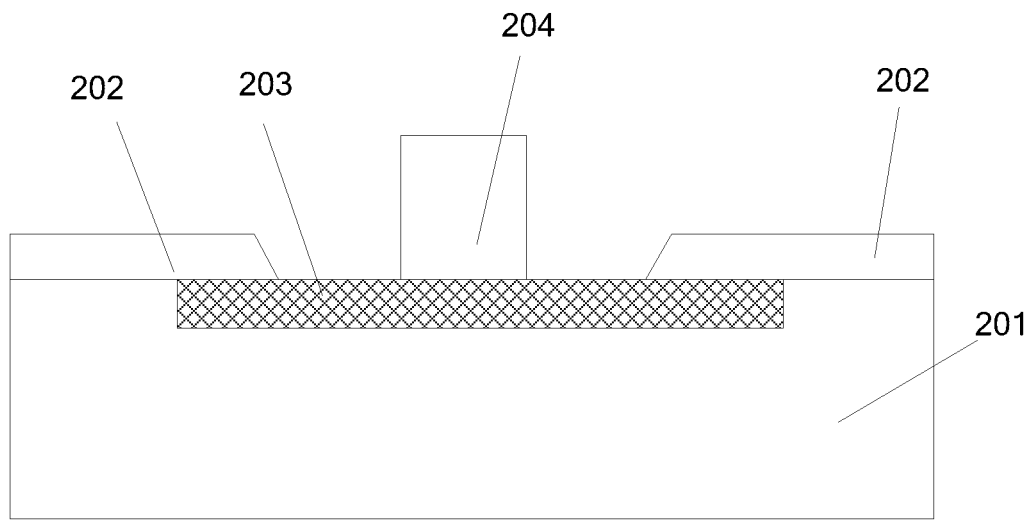
Figure 6:
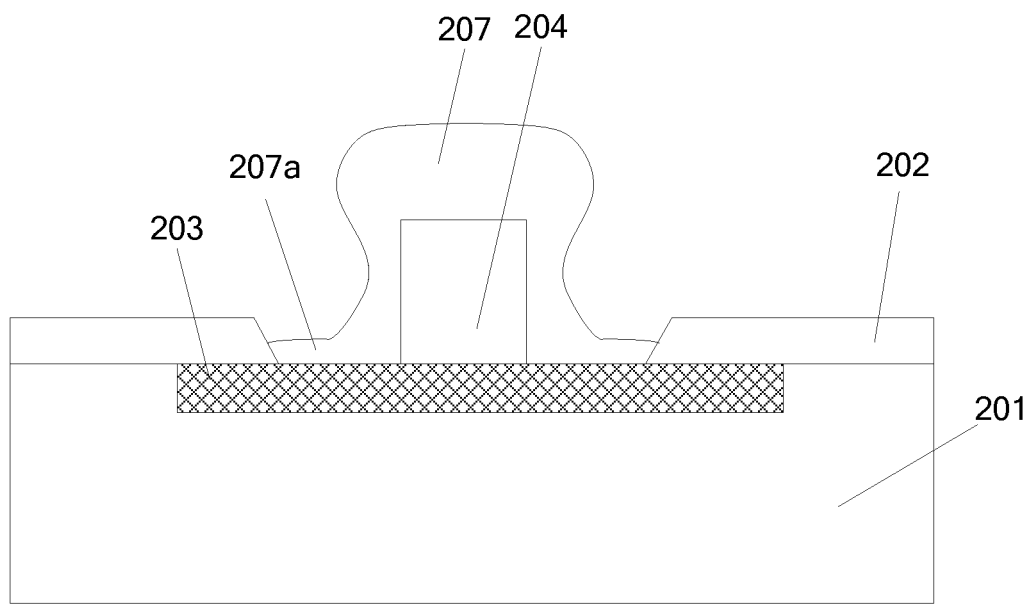

The chip packaging method is described in detail in conjunction with FIGS. 4 to 6.

Referring to FIG. 4, a semiconductor substrate 201 is provided, the semiconductor substrate 201 having a metal pad 203 and an insulating layer 202 formed thereon, the insulating layer 202 having an opening exposing the surface of the metal pad 203.

In some embodiments, the semiconductor substrate 201 may include monocrystalline silicon, SOI, a wafer of SiGe, or a wafer of compounds of III to V groups. The semiconductor substrate 201 may include a dielectric layer or a plurality of dielectric layers formed inside and on a surface of the semiconductor substrate 201. In some embodiments, the semiconductor substrate 201 may include semiconductor devices, metal interconnects and other semiconductor structures formed thereon.

In some embodiments, the insulating layer 202 has a passivation layer and a polymer layer (not shown). The passivation layer is adapted to protect the metal pad 203, isolate electrically, and form the opening exposing the surface of the metal pad 203, and may include silicon oxide, silicon nitride or a low-K material. The polymer layer is disposed on the passivation layer, has the opening exposing the surface of the metal pad 203, and may include polyimide, epoxy or benzocyclobutene. The metal pad 203 may be a top interconnect metal electrode of the semiconductor substrate 201. In some embodiments, the metal pad 203 may include gold, copper, aluminum or silver.

In some embodiments, the semiconductor substrate 201 may include monocrystalline silicon, and further include semiconductor devices, metal interconnects and other semiconductor structures formed thereon. The insulating layer 202 may include a passivation layer of silicon oxide and a polymer layer of polyimide. The insulating lay 202 has an opening exposing the surface of the metal pad 203 which is the top interconnect metal electrode of the semiconductor substrate 201 and includes copper.

Afterward, referring to FIG. 5, a sub-ball metal electrode 204 is formed on the metal pad 203. In some embodiments, the sub-ball metal electrode 204 may be adapted to connect the metal pad 203 and a solder ball to be formed. The sub-ball metal electrode 204 may include one of gold, copper and silver, or alloy including gold, copper or silver.

In some embodiments, the sub-ball metal electrode 204 may be formed by: forming a photoresist layer on a surface of the semiconductor substrate 201, the photoresist layer having the opening exposing the surface of the metal pad 203; filling a metal into the opening by an electroplating process, a physical vapor deposition process or an evaporation deposition process; and removing the photoresist layer, the metal forming the sub-ball metal electrode 204.

In some embodiments, the sub-ball metal electrode 204 may be formed by a wire bonding process, including: a metal wire reaching the top of the metal pad 203 by a bonding head; melting the metal wire using oxy-hydrogen flame or electrical sparkle generated by an electrical discharge system; the melted metal solidifying to form a metal ball with a diameter which is 1.5 to 4 times of a diameter of the metal wire under surface tension; dropping the bonding head; pressing the metal ball onto the metal pad 203 under a suitable pressure, temperature and energy at a suitable time, wherein the metal ball is applied with the pressure by the bonding head, and the wire metal and the metal pad 203 is activated to deform plastically and atoms therein may diffuse into each other, to form the sub-ball metal electrode 204; and cutting off the metal wire using a bonding clamp.

Afterward, referring to FIG. 6, a solder ball 207 is formed on a surface of the sub-ball metal electrode 204, the solder ball 207 having a first apron structure 207a which covers a portion of the metal pad 203 around the bottom of the sub-ball metal electrode 204. The first apron structure 207a may increase the contact area between the solder ball 207 and the metal pad 203, and enhance the adhesion between the solder ball 207 and the metal pad 203, such that the solder ball 207 is not prone to fall off the metal pad 203 under an external force.

In some embodiments, the solder ball 207 may be formed by a printing process, and include tin or alloy of tin. In some embodiments, the solder ball 207 may be formed by: printing a soldering paste on the sub-ball metal electrode 204 using a screen; and the soldering paste reflowing under a high temperature and becoming the solder ball 207 under surface tension. As the solder paste infiltrates the sub-ball metal electrode 204 and the metal pad 203, the solder ball 207 may cover the sub-ball metal electrode 204 and the metal pad 203. Thus, the solder ball 207 has the first apron structure 207a covering the portion of the metal pad 203 around the bottom of the sub-ball metal electrode 204.

Figure 7:
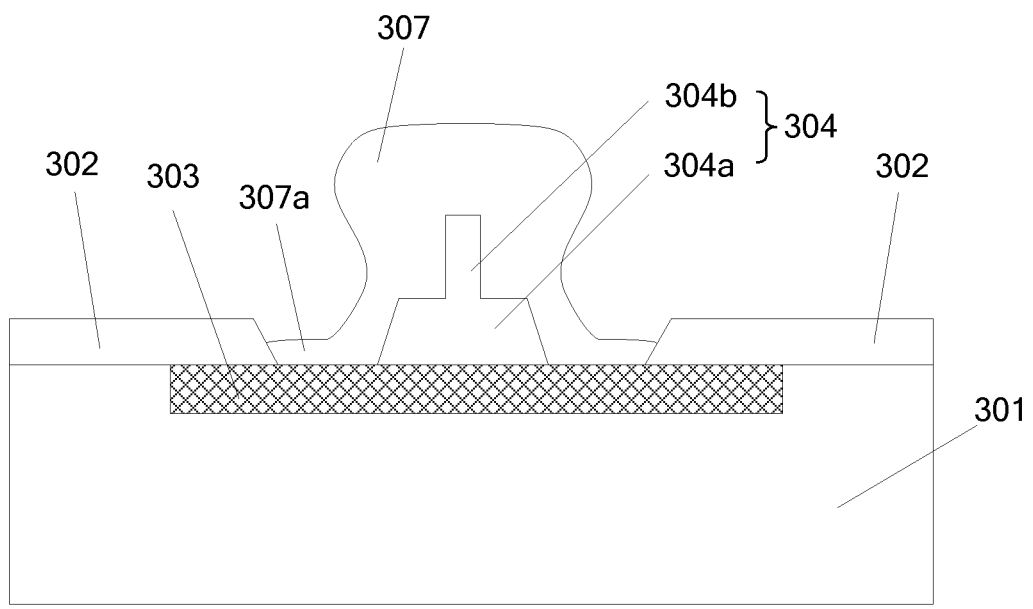
FIG. 7 schematically illustrates a diagram of a chip package structure according to an embodiment of the present disclosure.

FIG. 7 schematically illustrates a diagram of a chip package structure according to an embodiment of the present disclosure. The chip package structure includes: a semiconductor substrate 301; a metal pad 303 inside the semiconductor substrate 301; an insulating layer 302 on the semiconductor substrate 301, the insulating layer 302 having an opening exposing a surface of the metal pad 303; a sub-ball metal electrode 304 on the surface of the metal pad 203, wherein the sub-ball metal electrode 304 includes a main body 304a and an end portion 304b, the main body 304a is a lower portion of the sub-ball metal electrode 304 which is connected with the metal pad 303, and the end portion 304b is an upper portion of the sub-ball metal electrode 304; and a solder ball 307 on a surface of the sub-ball metal electrode 304, the solder ball 307 having a first apron structure 307a which covers a portion of the metal pad 303 around the bottom of the sub-ball metal electrode 304.

Different from the embodiment shown in FIGS. 2 to 6, in the embodiment shown in FIGS. 7 to 10, the sub-ball metal electrode 304 includes the main body 304a and the end portion 304b, wherein the main body 304a is the lower portion of the sub-ball metal electrode 304 which is connected with the metal pad 303, and the end portion 304b is the upper portion of the sub-ball metal electrode 304. The main body 304a connects the metal pad 303 to the solder ball 307, and supports the end portion 304b. From FIG. 7, the projection of the main body 304a on the surface of the metal pad 303 is larger than the projection of the end portion 304b on the surface of the metal pad 303. The end portion 304b enters into the solder ball 307, thereby increasing the contact area between the sub-ball metal electrode 304 and the solder ball 307. In this way, the adhesion between the sub-ball metal electrode 304 and the solder ball 307 is enhanced, when suffering an external force, the solder ball 307 is not prone to fall off the sub-ball metal electrode 304.

In some embodiments, the sub-ball metal electrode 304 may be formed by a wire bonding process. In some embodiments, the sub-ball metal electrode 304 may be formed by: a metal wire reaching the top of the metal pad 303 by a bonding head; melting the metal wire using oxy-hydrogen flame or electrical sparkle generated by an electrical discharge system; the melted metal solidifying to form a metal ball with a diameter which is 1.5 to 4 times of a diameter of the metal wire under surface tension; dropping the bonding head; pressing the metal ball onto the metal pad 303 under a suitable pressure, temperature and energy at a suitable time, wherein the metal ball is applied with the pressure by the bonding head, and the wire metal and the metal pad 303 is activated to deform plastically and atoms therein may diffuse into each other, to form main body 304a of the sub-ball metal electrode 304; uplifting the bonding head, and the metal wire generating an arc portion having a certain height (a length of the end portion 304b); and cutting off the metal wire using a bonding clamp, the metal wire on the main body 304a being the end portion 304b, the main body 304a and the end portion 304b constituting the sub-ball metal electrode 304. It should be noted that, the wire bonding process is generally used to connect an inner chip in a semiconductor package with an external pin, or connect chips. The inventors of the present disclosure improve the wire bonding process and apply it into formation of the sub-ball metal electrode 304. When the main body 304a is formed, the bonding head is uplifted and thus the metal wire generates the arc portion to form the end portion 304b. The process is relatively simple and costs a relatively short time period.

The sub-ball metal electrode 304 may include one of gold, copper and silver, or alloy including gold, copper or silver. In some embodiments, the height of the end portion 304b is 0.005 to 1.5 times to the height of the main body 304a. If the height of the end portion 304b is less than 0.005 times to the height of the main body 304a, the end portion 304b enters into the solder ball 307 by a limited length, thus, the adhesion between the sub-ball metal electrode 304 and the solder ball 307 may be improved by a limited range. If the height of the end portion 304b is greater than 1.5 times to the height of the main body 304a, the end portion 304b is formed by a generated arc portion in the wire bonding process and has a diameter smaller than that of the main body 304a, and the metal is relatively soft, thus, the end portion 304b is prone to deform and further the yield may be reduced, which may affect the chip packaging.

In some embodiments, the sub-ball metal electrode 304 may include copper, and the height of the end portion 304b may be the same with the main body 304a.

In the embodiment shown in FIGS. 7 to 10, materials and structures of the semiconductor substrate 301, the insulating layer 302, the metal pad 303 and the solder ball 307 may be similar with the embodiment shown in FIGS. 2 to 6, and are not described in detail here.

Figure 8:
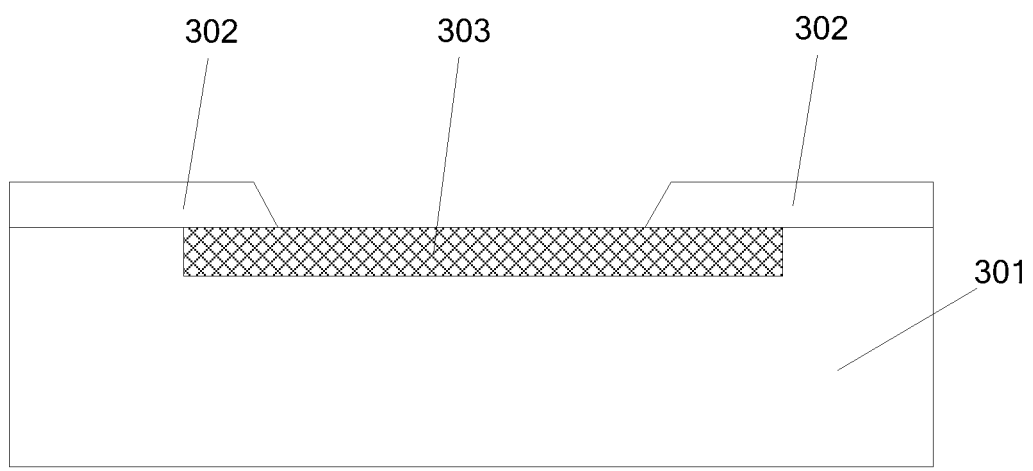
FIGS. 8 to 10 schematically illustrate cross-sectional views of intermediate structures of the method shown in FIG. 7.
Figure 9:
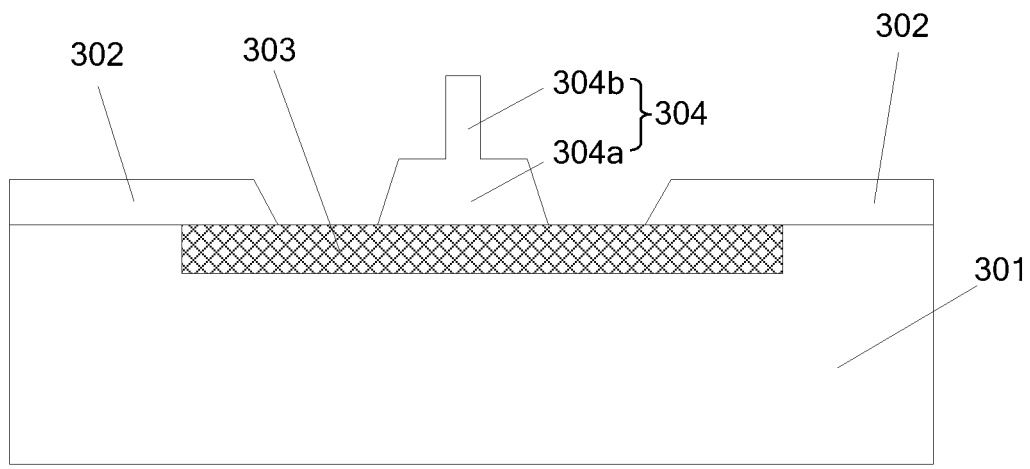
Figure 10:
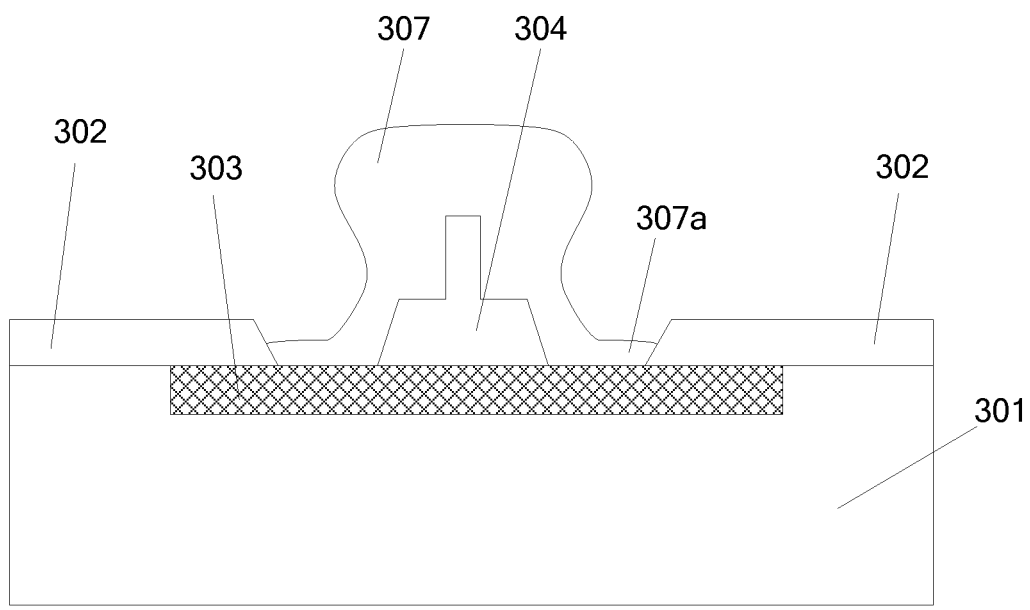

Referring to FIGS. 8 to 10, FIGS. 8 to 10 schematically illustrate cross-sectional views of intermediate structures of the method shown in FIG. 7.

Referring to FIG. 8, a semiconductor substrate 301 is provided, the semiconductor substrate 301 having a metal pad 303 and an insulating layer 302 formed thereon, the insulating layer 302 having an opening exposing the surface of the metal pad 303. The detailed forming processes and description may be similar with the embodiment shown in FIGS. 2 to 6, and are not described in detail here.

Afterward, referring to FIG. 9, a sub-ball metal electrode 304 is formed on the metal pad 303. In some embodiments, the sub-ball metal electrode 304 may be adapted to connect the metal pad 303 and a solder ball to be formed. The sub-ball metal electrode 304 may include one of gold, copper and silver, or alloy including gold, copper or silver.

In some embodiments, the sub-ball metal electrode 304 may include the main body 304a and the end portion 304b, wherein the main body 304a is the lower portion of the sub-ball metal electrode 304 which is connected with the metal pad 303, and the end portion 304b is the upper portion of the sub-ball metal electrode 304. The main body 304a connects the metal pad 303 to the solder ball 307, and supports the end portion 304b. The end portion 304b enters into the solder ball 307, thereby increasing the contact area between the sub-ball metal electrode 304 and the solder ball 307. In this way, the adhesion between the sub-ball metal electrode 304 and the solder ball 307 is enhanced, when suffering an external force, the solder ball 307 is not prone to fall off the sub-ball metal electrode 304.

In some embodiments, the sub-ball metal electrode 304 is formed by a wire bonding process, including: bonding a metal wire with the metal pad 303 to form the main body 304a; the metal wire generating an arc portion having a certain height to form the end portion 304b; and cutting the metal wire using a clamp to form the sub-ball metal electrode 304.

In some embodiments, the sub-ball metal electrode 304 may be formed by: a metal wire reaching the top of the metal pad 303 by a bonding head; melting the metal wire using oxy-hydrogen flame or electrical sparkle generated by an electrical discharge system; the melted metal solidifying to form a metal ball with a diameter which is 1.5 to 4 times of a diameter of the metal wire under surface tension; dropping the bonding head; pressing the metal ball onto the metal pad 303 under a suitable pressure, temperature and energy at a suitable time, wherein the metal ball is applied with the pressure by the bonding head, and the wire metal and the metal pad 303 is activated to deform plastically and atoms therein may diffuse into each other, to form main body 304a of the sub-ball metal electrode 304; uplifting the bonding head, and the metal wire generating an arc portion having a certain height (a length of the end portion 304b); and cutting off the metal wire using a bonding clamp, the metal wire on the main body 304a being the end portion 304b, the main body 304a and the end portion 304b constituting the sub-ball metal electrode 304. It should be noted that, the wire bonding process is generally used to connect an inner chip in a semiconductor package with an external pin, or connect chips. The inventors of the present disclosure improve the wire bonding process and apply it into formation of the sub-ball metal electrode 304. When the main body 304a is formed, the bonding head is uplifted and thus the metal wire generates the arc portion to form the end portion 304b. The process is relatively simple and costs a relatively short time period.

The sub-ball metal electrode 304 may include one of gold, copper and silver, or alloy including gold, copper or silver. In some embodiments, the height of the end portion 304b is 0.005 to 1.5 times to the height of the main body 304a. If the height of the end portion 304b is less than 0.005 times to the height of the main body 304a, the end portion 304b enters into the solder ball 307 by a limited length, thus, the adhesion between the sub-ball metal electrode 304 and the solder ball 307 may be improved by a limited range. If the height of the end portion 304b is greater than 1.5 times to the height of the main body 304a, the end portion 304b is formed by a generated arc portion in the wire bonding process and has a diameter smaller than that of the main body 304a, and the metal is relatively soft, thus, the end portion 304b is prone to deform, which may affect the shape of the solder ball to be formed and further reduce the yield. Therefore, the chip packaging may be affected.

In some embodiments, the sub-ball metal electrode 304 may include copper, and the height of the end portion 304b may be the same with the main body 304a.

Afterward, referring to FIG. 10, the solder ball 307 is formed on a surface of the sub-ball metal electrode 304, the solder ball 307 having a first apron structure 307a which covers a portion of the metal pad 303 around the bottom of the sub-ball metal electrode 304. The detailed forming processes and description may be similar with the embodiment shown in FIGS. 2 to 6, and are not described in detail here.

FIG. 11 schematically illustrates a diagram of a chip package structure according to an embodiment of the present disclosure. The chip package structure includes: a semiconductor substrate 401; a metal pad 403 inside the semiconductor substrate 401; an insulating layer 402 on the semiconductor substrate 401, the insulating layer 402 having an opening exposing a surface of the metal pad 403; a sub-ball metal electrode 404 on the surface of the metal pad 403, wherein the sub-ball metal electrode 404 includes a main body and an end portion, the main body is a lower portion of the sub-ball metal electrode 404 which is connected with the metal pad 403, and the end portion is an upper portion of the sub-ball metal electrode 404; a covering layer having a second apron structure on a surface of the sub-ball metal electrode 404, the second apron structure covering a portion of the metal pad 403 around the bottom of the sub-ball metal electrode 404; and a solder ball 407 on a surface of the covering layer, the solder ball 407 having a first apron structure 407a which covers the second apron structure. From FIG. 11, the covering layer is disposed between the solder ball 407 and the sub-ball metal electrode 404, and between the solder ball 407 and the surface of the metal pad 403.

Different from the embodiment shown in FIGS. 7 to 10, in the third embodiment shown in FIGS. 11 to 17, the sub-ball metal electrode 404 has the covering layer formed thereon, and the covering layer has the second apron structure which covers the portion of the metal pad 403 around the bottom of the sub-ball metal electrode 404. The covering layer is a stacked structure including an anti-diffusion layer 405 and a wetting layer 406, wherein the anti-diffusion layer 405 is disposed on a surface of the sub-ball metal electrode 404, and the wetting layer 406 is disposed on a surface of the anti-diffusion layer 405. In some embodiments, the anti-diffusion layer 405 may have a third apron structure 405a, and the wetting layer 406 may have a fourth apron structure 406a. The second apron structure is a stacked structure including the third apron structure 405a and the fourth apron structure 406a.

The anti-diffusion layer 405 has the third apron structure 405a covering the surface of the metal pad 403, which increases the contact area between the anti-diffusion layer 405 and the metal pad 403, and thus improves the adhesion between the anti-diffusion layer 405 and the metal pad 403. Besides, the anti-diffusion layer 405 surrounds the sub-ball metal electrode 404, thus, the adhesion between the sub-ball metal electrode 404 and the metal pad 403 may be improved. Therefore, the sub-ball metal electrode 404 is not prone to fall off the metal pad 403 under an external force.

In some embodiments, the anti-diffusion layer 405 may include nickel. Compared with the sub-ball metal electrode 404, intermetallic compounds may be generated more slowly between the anti-diffusion layer 405 and the solder ball 407. Thus, the anti-diffusion layer 405 may serve as a resist layer between the sub-ball metal electrode 404 and the solder ball 407, to prevent the generation of intermetallic compounds and cavities which may affect the mechanical strength and service life of welded points. Therefore, the anti-diffusion layer 405 may effectively avoid intermetallic compounds and improve the reliability of chip packaging. In some embodiments, the anti-diffusion layer 405 may have a thickness from 0.05 μm to 5 μm. In some embodiments, the thickness of the anti-diffusion layer 405 may be related to processes in a chip packaging procedure. The lower the process temperature in the chip packaging procedure is, the thinner the anti-diffusion layer 405 is. In some embodiments, the anti-diffusion layer 405 may include nickel, and have a thickness from 0.5 μm to 3 μm.

In some embodiments, the anti-diffusion layer 405 may include nickel. As nickel is prone to be oxidized, which increases the interface resistivity. Thus, the wetting layer 406 is formed on the surface of the anti-diffusion layer 405 to prevent the oxidization of the anti-diffusion layer 405. Besides, the wetting layer 406 and the solder ball 407 infiltrate into each other to improve the adhesion therebetween. In some embodiments, the wetting layer 406 may include one selected from tin, gold and silver, or alloy of tin, gold or silver. The wetting layer 406 has the fourth apron structure 406a which increases the contact area between the wetting layer 406 and the anti-diffusion layer 405. The fourth apron structure 406a along with the third apron structure 405a improves the adhesion between the covering layer and the metal pad 403. The fourth apron structure 406a and the third apron structure 405a constitute the second apron structure. In some embodiments, the wetting layer 406 may have a thickness from 0.05 μm to 10 μm. In some embodiments, the thickness of the wetting layer 406 may be related to processes in a chip packaging procedure. In some embodiments, the wetting layer 406 may include tin as tin is not prone to be oxidized in the air. Besides, tin and the solder ball 407 may infiltrate into each other, which may improve the adhesion. In some embodiments, the wetting layer 406 may have a thickness from 0.1 μm to 5 μm.

In the embodiment shown in FIGS. 11 to 17, materials and structures of the semiconductor substrate 401, the insulating layer 402, the metal pad 403, the sub-ball metal electrode 404 and the solder ball 407 may be similar with the embodiment shown in FIGS. 7 to 10, and are not described in detail here.

Referring to FIG. 12, FIG. 12 schematically illustrates a diagram of a flow chart of a chip packaging method of the chip package structure in FIG. 11. The method includes S201 to S204.

In S201, a semiconductor substrate is provided, the semiconductor substrate having a metal pad and an insulating layer formed thereon, the insulating layer having an opening exposing a surface of the metal pad.

In S202, a sub-ball metal electrode is formed on the surface of the metal pad.

In S203, a covering layer is formed on a surface of the sub-ball metal electrode, the covering layer having a second apron structure which covers a portion of the metal pad around the bottom of the sub-ball metal electrode.

In S204, a solder ball is formed on a surface of the covering layer, the solder ball having a first apron structure which covers the second apron structure.

The chip packaging method is described in detail in conjunction with FIGS. 13 to 17.

Figure 13:
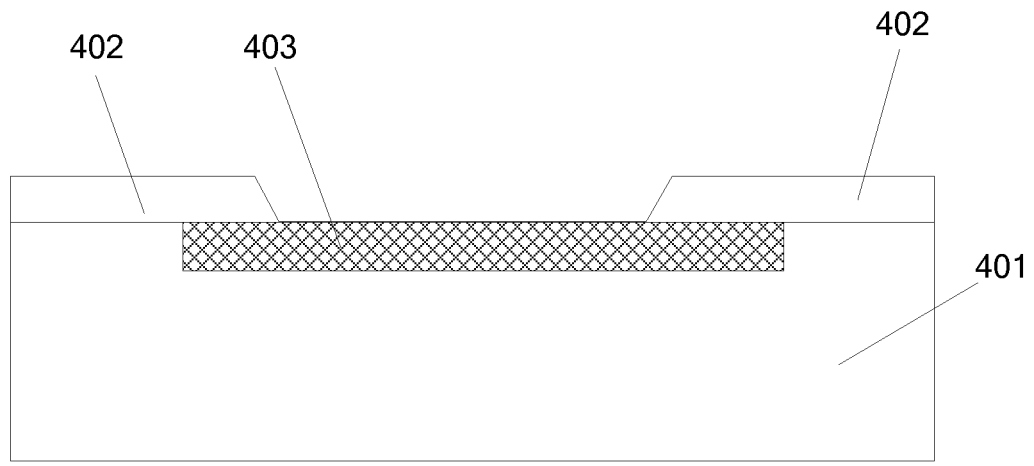
FIGS. 13 to 17 schematically illustrate cross-sectional views of intermediate structures of the method shown in FIG. 11.

Referring to FIG. 13, a semiconductor substrate 401 is provided, the semiconductor substrate 401 having a metal pad 403 and an insulating layer 402 formed thereon, the insulating layer 402 having an opening exposing the surface of the metal pad 403. The detailed forming processes and description may be similar with the embodiment shown in FIGS. 2 to 6, and are not described in detail here.

Figure 14:
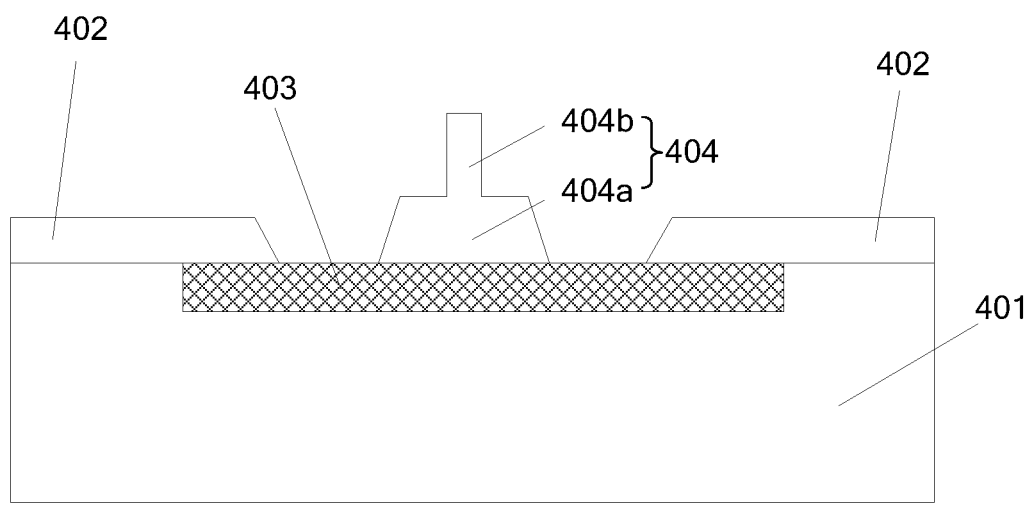

Afterward, referring to FIG. 14, a sub-ball metal electrode 404 is formed on the metal pad 403. In some embodiments, the sub-ball metal electrode 404 may include a main body 404a and an end portion 404b, wherein the main body 404a is the lower portion of the sub-ball metal electrode 404 which is connected with the metal pad 403, and the end portion 404b is the upper portion of the sub-ball metal electrode 404. The detailed forming processes and description may be similar with the embodiment shown in FIGS. 7 to 10, and are not described in detail here.

Figure 15:
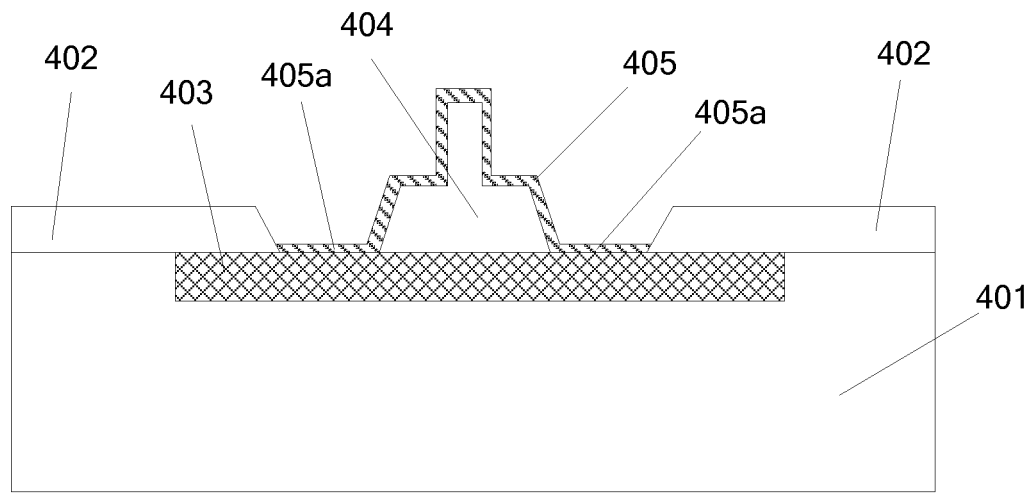
Figure 16:
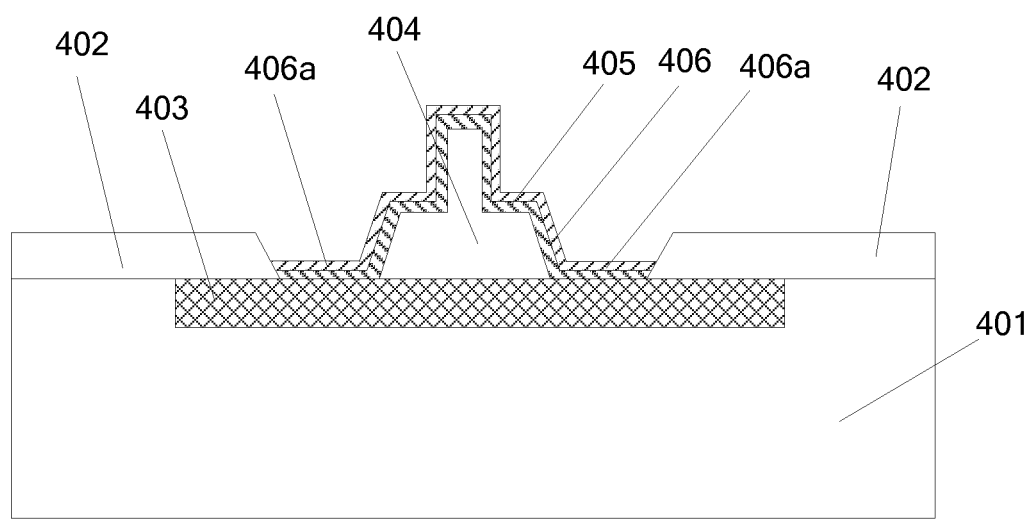

Afterward, referring to FIGS. 15 and 16, a covering layer is formed on a surface of the sub-ball metal electrode 404, the covering layer having a second apron structure which covers a portion of the metal pad 403 around the bottom of the sub-ball metal electrode 404. The covering layer is a stacked structure including an anti-diffusion layer 405 and a wetting layer 406, wherein the anti-diffusion layer 405 is disposed on a surface of the sub-ball metal electrode 404, and the wetting layer 406 is disposed on a surface of the anti-diffusion layer 405.

In some embodiments, the anti-diffusion layer 405 may have a third apron structure 405a, and the wetting layer 406 may have a fourth apron structure 406a. The second apron structure is a stacked structure including the third apron structure 405a and the fourth apron structure 406a.

FIG. 15 schematically illustrates a cross-sectional view of forming the anti-diffusion layer 405 on the surface of the sub-ball metal electrode 404. The anti-diffusion layer 405 has the third apron structure 405a, and may be formed by a chemical plating process. The chemical plating process, also called an electroless plating process, denotes to a method for forming a metal plating layer on a surface of a part to be plated using oxidation-reduction reactions without a power supply. The obtained metal plating layer is even, the chemical plating device is simple, and no power supply and no positive pole is required. The anti-diffusion layer 405 formed on the surface of the sub-ball metal electrode 404 by the chemical plating process has the third apron structure 405a covering the portion of the metal pad 403 around the bottom of the sub-ball metal electrode 404, which increases the contact area between the anti-diffusion layer 405 and the metal pad 403, and thus improves the adhesion between the anti-diffusion layer 405 and the metal pad 403. Besides, the anti-diffusion layer 405 surrounds the sub-ball metal electrode 404, thus, the adhesion between the sub-ball metal electrode 404 and the metal pad 403 may be improved. Therefore, the sub-ball metal electrode 404 is not prone to fall off the metal pad 403 under an external force.

In some embodiments, the anti-diffusion layer 405 may include nickel. Compared with the sub-ball metal electrode 404, intermetallic compounds may be generated more slowly between the anti-diffusion layer 405 and the solder ball 407. Thus, the anti-diffusion layer 405 may serve as a resist layer between the sub-ball metal electrode 404 and the solder ball 407, to prevent the generation of intermetallic compounds and cavities which may affect the mechanical strength and service life of welded points. Therefore, the anti-diffusion layer 405 may effectively avoid intermetallic compounds and improve the reliability of chip packaging. In some embodiments, the anti-diffusion layer 405 may have a thickness from 0.05 μm to 5 μm. In some embodiments, the thickness of the anti-diffusion layer 405 may be related to processes in a chip packaging procedure. The lower the process temperature in the chip packaging procedure is, the thinner the anti-diffusion layer 405 is. In some embodiments, the anti-diffusion layer 405 may include nickel, and have a thickness from 0.5 μm to 5 μm.

In some embodiments, before the chemical plating process, the sub-ball metal electrode 404 may be processed to remove an oxidation film thereon, to reduce the contact resistance. Then, the chemical plating process is performed on the surface of the sub-ball metal electrode 404 to form a film of nickel which has a diameter from 0.5 μm to 3 μm.

FIG. 16 schematically illustrates a cross-sectional view of forming the wetting layer 406 on the surface of the anti-diffusion layer 405. In some embodiments, the anti-diffusion layer 405 may include nickel. As nickel is prone to be oxidized, which increases the interface resistivity. Thus, the wetting layer 406 is formed on the surface of the anti-diffusion layer 405 to prevent the oxidization of the anti-diffusion layer 405. Besides, the wetting layer 406 and the solder ball 407 infiltrate into each other to improve the adhesion therebetween. In some embodiments, the wetting layer 406 may include one selected from tin, gold and silver, or alloy of tin, gold or silver. The wetting layer 406 may be formed by a chemical plating process and have the fourth apron structure 406a which increases the contact area between the wetting layer 406 and the anti-diffusion layer 405. The fourth apron structure 406a along with the third apron structure 405a improves the adhesion between the covering layer and the metal pad 403. The fourth apron structure 406a and the third apron structure 405a constitute the second apron structure. In some embodiments, the wetting layer 406 may have a thickness from 0.05 μm to 10 μm. In some embodiments, the thickness of the wetting layer 406 may be related to processes in a chip packaging procedure.

In some embodiments, the wetting layer 406 may include a tin film as tin is not prone to be oxidized in the air. Besides, tin and the solder ball 407 may infiltrate into each other, which may improve the adhesion. In some embodiments, the tin layer may be formed by a chemical plating process, have the apron structure, and have a thickness from 0.1 μm to 5 μm.

Figure 17:
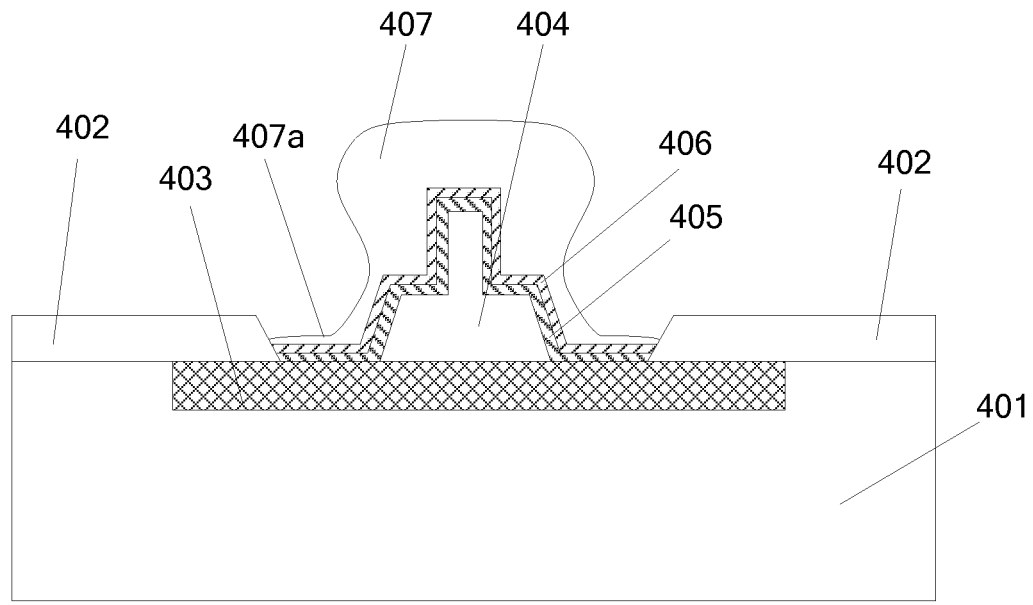

Afterward, referring to FIG. 17, a solder ball 407 is formed on a surface of the covering layer, the solder ball 407 having a first apron structure 407a which covers the second apron structure. The detailed forming processes and description may be similar with the embodiment shown in FIGS. 2 to 6, and are not described in detail here.

Figure 18:
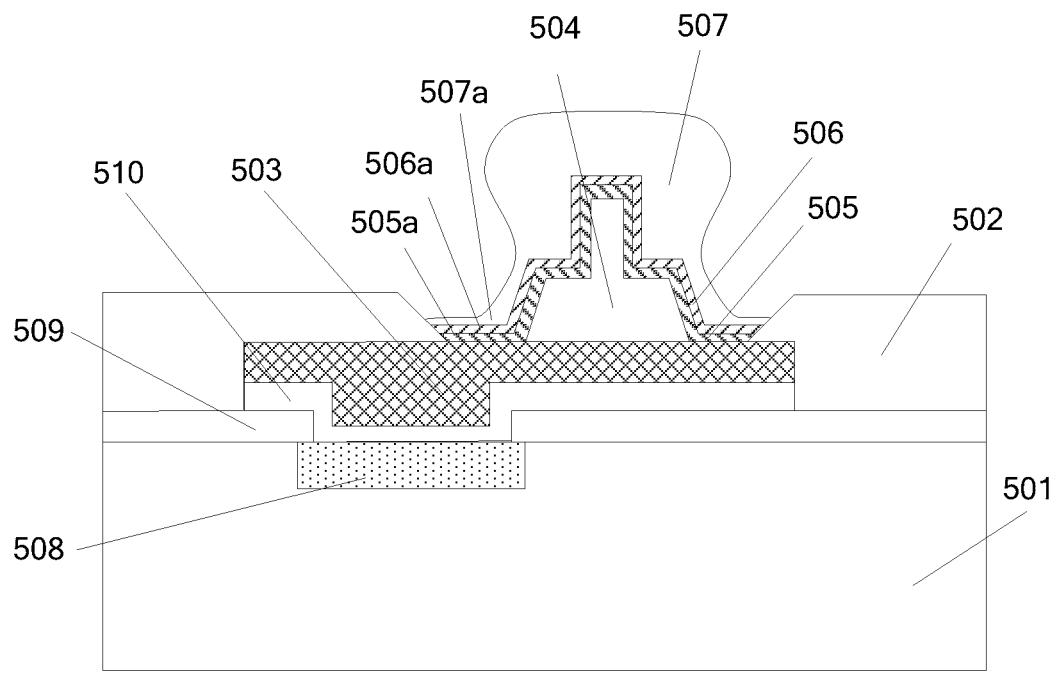
FIG. 18 schematically illustrates a diagram of a chip package structure according to an embodiment of the present disclosure.

FIG. 18 schematically illustrates a diagram of a chip package structure according to an embodiment of the present disclosure. The chip package structure includes: a semiconductor substrate 501; a metal electrode 508 inside the semiconductor substrate 501; a first insulating layer 509 on the semiconductor substrate 501, the first insulating layer 509 covering a portion of the metal electrode 508 and having a first opening exposing the metal electrode 508; a metal transition layer 510 covering sidewalls and the bottom of the first opening, wherein a second opening is formed in the metal transition layer 510 along a surface of the first opening; a metal pad 503 on the metal transition layer 510, the metal pad 503 filling the second opening; a second insulating layer 502 on the metal pad 503, the second insulating layer 502 having a third opening exposing the metal pad 503; a sub-ball metal electrode 504 on the metal pad 503, wherein the sub-ball metal electrode 504 includes a main body and an end portion, the main body is a lower portion of the sub-ball metal electrode 504 which is connected with the metal pad 503, and the end portion is an upper portion of the sub-ball metal electrode 504; a covering layer having a second apron structure on a surface of the sub-ball metal electrode 504, the second apron structure covering a portion of the metal pad 503 around the bottom of the sub-ball metal electrode 504; and a solder ball 507 on a surface of the covering layer, the solder ball 507 having a first apron structure 507a which covers the second apron structure.

Different from the=embodiment shown in FIGS. 11 to 17, in the embodiment shown in FIGS. 18 to 23, the metal pad 503 is a Redistribution Layer (RDL) pad. The RDL pad is formed by forming the first insulating layer 509, the metal transition layer 510 and the second insulating layer 502 on the semiconductor substrate 501. A position of the metal electrode 508 inside the semiconductor substrate 501 is redistributed to a position of the RDL pad according to design specifications of packaging processes. The RDL pad may greatly reduce the size of the chip packaging to meet the requirements of high-density package and to improve the rate and the reliability of data transmission. Methods for forming the RDL pad are well known to those skilled in the art, and are not described in detail here.

In the embodiment shown in FIGS. 18 to 23, materials and structures of the semiconductor substrate 501, the sub-ball metal electrode 504, an anti-diffusion layer 505, a wetting layer 506 and the solder ball 507 may be similar with the embodiment shown in FIGS. 11 to 17, and are not described in detail here.

Referring to FIGS. 19 to 23, FIGS. 19 to 23 schematically illustrate cross-sectional views of intermediate structures of the method shown in FIG. 18.

Figure 19:
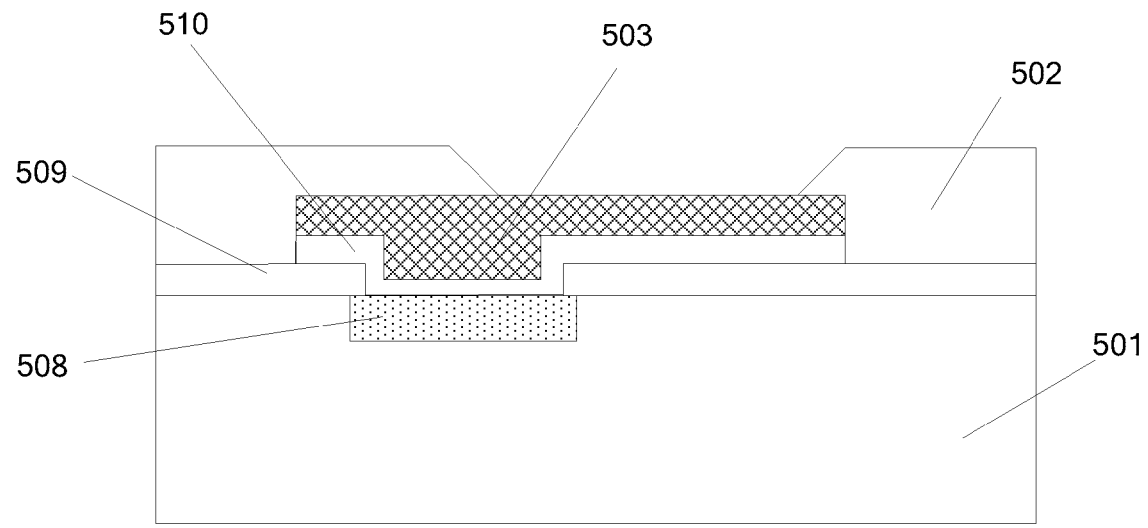
FIGS. 19 to 23 schematically illustrate cross-sectional views of intermediate structures of the method shown in FIG. 18.

Referring to FIG. 19, a semiconductor substrate 501 is provided. The semiconductor substrate 501 includes: a metal electrode 508 inside the semiconductor substrate 501; a first insulating layer 509 on the semiconductor substrate 501, the first insulating layer 509 covering a portion of the metal electrode 508 and having a first opening exposing the metal electrode 508; a metal transition layer 510 covering sidewalls and the bottom of the first opening, wherein a second opening is formed in the metal transition layer 510 along a surface of the first opening; a metal pad 503 on the metal transition layer 510, the metal pad 503 filling the second opening; and a second insulating layer 502 on the metal pad 503, the second insulating layer 502 having a third opening exposing the metal pad 503.

Different from the embodiment shown in FIGS. 11 to 17, in the embodiment shown in FIGS. 18 to 23, the metal pad 503 is a Redistribution Layer (RDL) pad. The RDL pad is formed by forming the first insulating layer 509, the metal transition layer 510 and the second insulating layer 502 on the semiconductor substrate 501. A position of the metal electrode 508 inside the semiconductor substrate 501 is redistributed to a position of the RDL pad according to design specifications of packaging processes. The RDL pad may greatly reduce the size of the chip packaging to meet the requirements of high-density package and to improve the rate and the reliability of data transmission. Methods for forming the RDL pad are well known to those skilled in the art, and are not described in detail here.

Figure 20:
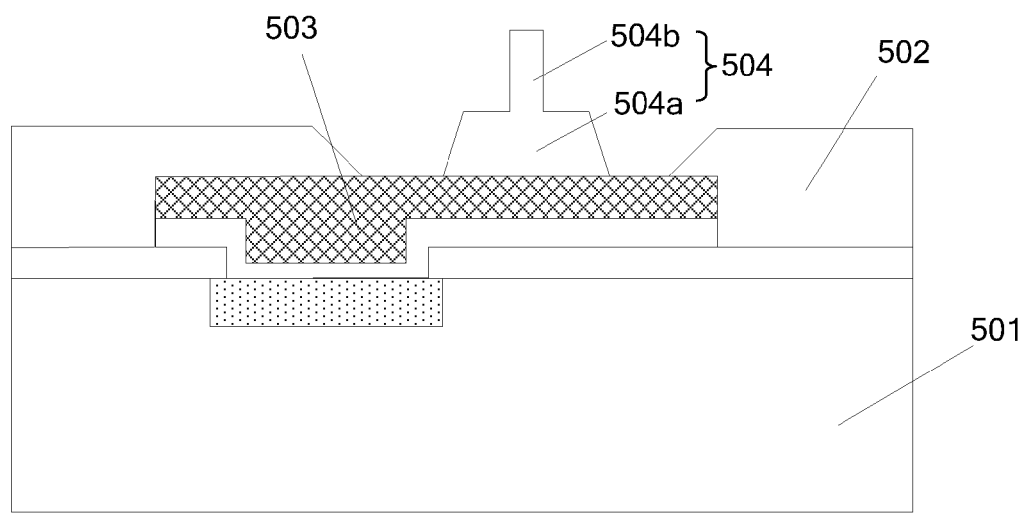

Afterward, referring to FIG. 20, a sub-ball metal electrode 504 is formed on the metal pad 503. In some embodiments, the sub-ball metal electrode 504 may include a main body 504a and an end portion 504b, wherein the main body 504a is the lower portion of the sub-ball metal electrode 504 which is connected with the metal pad 503, and the end portion 504b is the upper portion of the sub-ball metal electrode 504.

Figure 21:
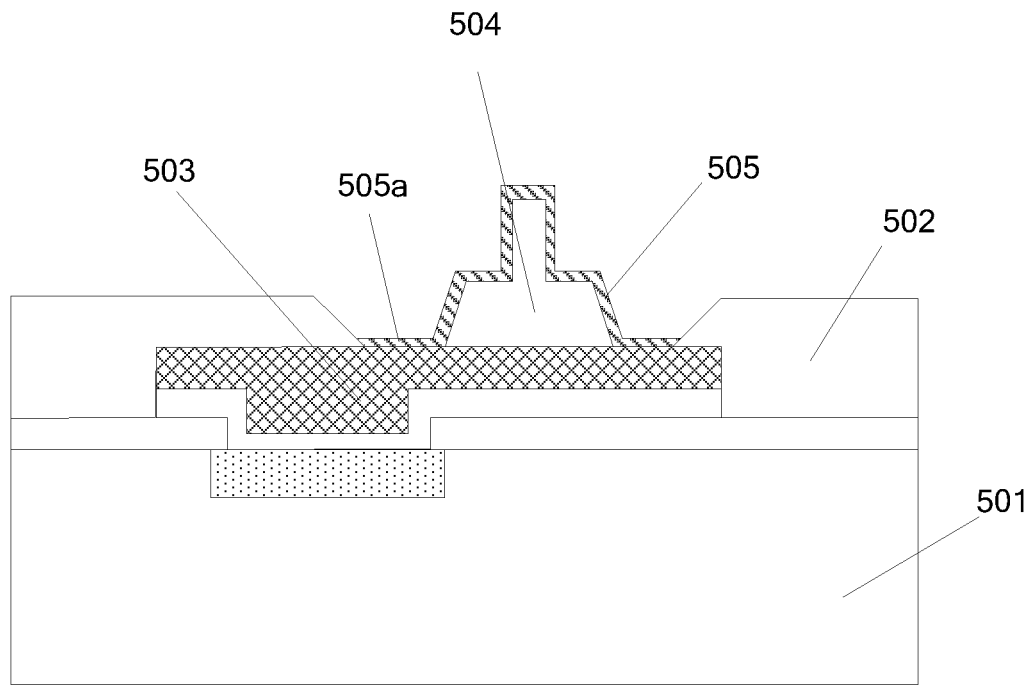
Figure 22:
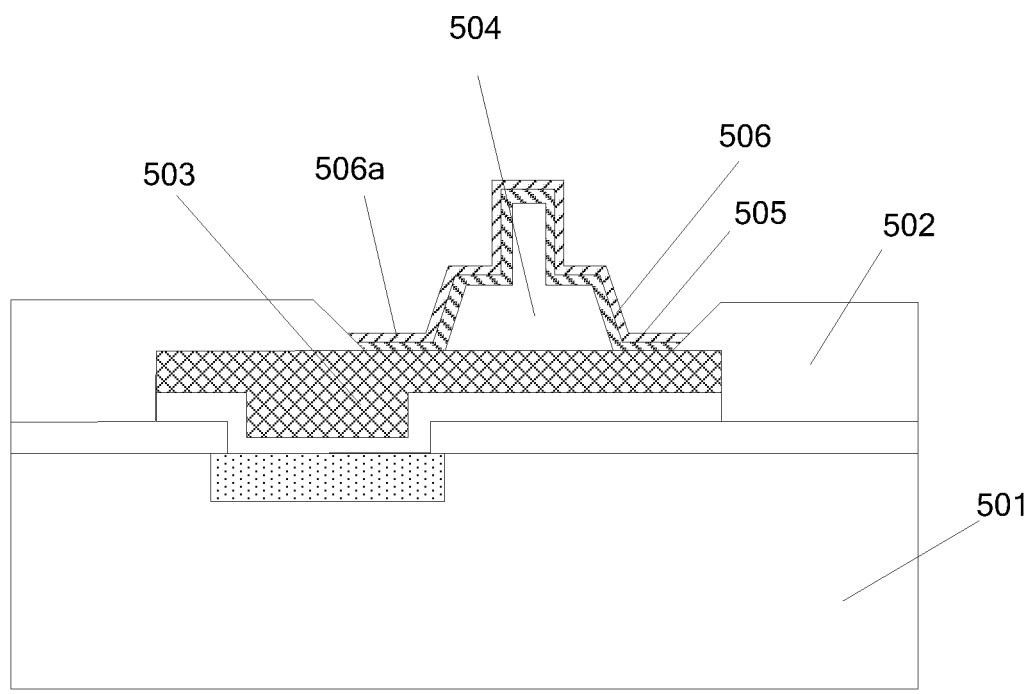

Afterward, referring to FIGS. 21 and 22, a covering layer is formed on a surface of the sub-ball metal electrode 504, the covering layer having a second apron structure which covers a portion of the metal pad 503 around the bottom of the sub-ball metal electrode 504. The covering layer is a stacked structure including an anti-diffusion layer 505 and a wetting layer 506, wherein the anti-diffusion layer 505 is disposed on a surface of the sub-ball metal electrode 504, and the wetting layer 506 is disposed on a surface of the anti-diffusion layer 505. In some embodiments, the anti-diffusion layer 505 may have a third apron structure 505a, and the wetting layer 506 may have a fourth apron structure 506a. The second apron structure is a stacked structure including the third apron structure 505a and the fourth apron structure 506a.

Figure 23:
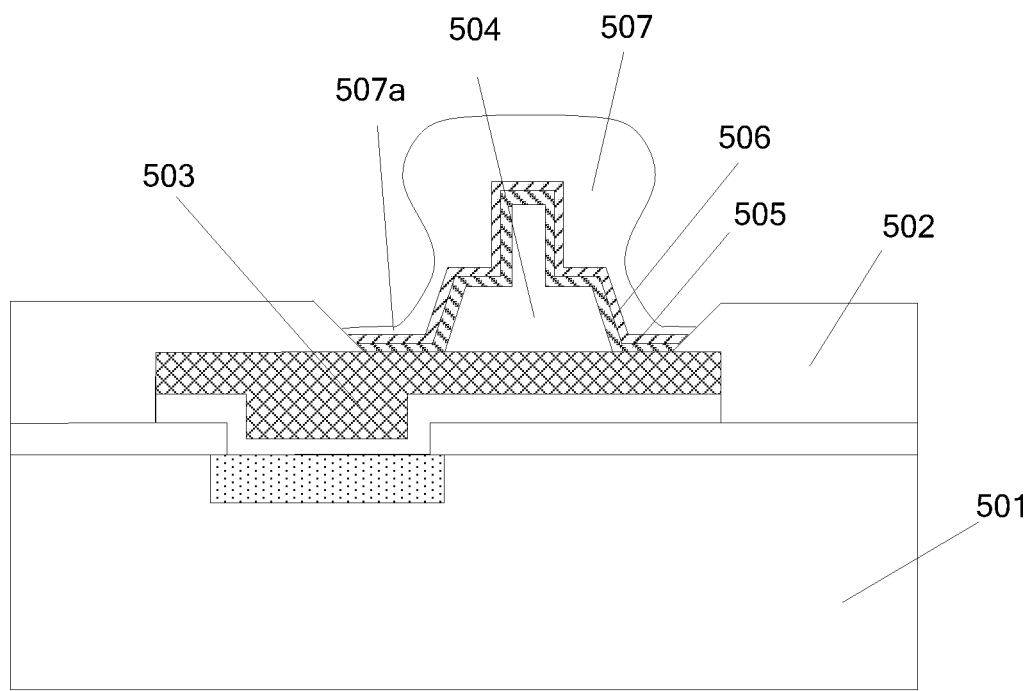

Afterward, referring to FIG. 23, a solder ball 507 is formed on a surface of the covering layer, the solder ball 507 having a first apron structure 507a which covers the second apron structure.

The detailed forming processes and description may be similar with the embodiment shown in FIGS. 2 to 6, and are not described in detail here.

From above, the present disclosure may have following advantages. The solder ball has the first apron structure which covers a portion of the pad around the bottom of the sub-ball metal electrode. The first apron structure increases the contact area between the solder ball and the metal pad, and enhances the adhesion between the solder ball and the metal pad, such that the solder ball is not prone to fall off the metal pad under an external force.

In some embodiments, the sub-ball metal electrode include the main body and the end portion, wherein the main body is the lower portion of the sub-ball metal electrode which is connected with the metal pad, and the end portion is the upper portion of the sub-ball metal electrode. The end portion enters into the solder ball, thereby increasing the contact area between the sub-ball metal electrode and the solder ball. In this way, the adhesion between the sub-ball metal electrode and the solder ball is enhanced, when suffering an external force, the solder ball is not prone to fall off the sub-ball metal electrode. Further, the sub-ball metal electrode is formed by a wire bonding process, including: bonding a metal wire with the metal pad to form the main body; the metal wire generating an arc portion having a certain height to form the end portion; and cutting the metal wire using a clamp to form the sub-ball metal electrode. Compared with the existing techniques, the above wire bonding process is simpler and requires lower cost.

In some embodiments, the covering layer is a stacked structure including the anti-diffusion layer and the wetting layer, wherein the anti-diffusion layer is disposed on the surface of the sub-ball metal electrode, and the wetting layer is disposed on the surface of the anti-diffusion layer. In the existing techniques, a solder ball is directly formed on a sub-ball metal electrode, thus, intermetallic compounds and cavities may be formed between the sub-ball metal electrode and the solder ball due to the diffusion of atoms. The intermetallic compounds are fragile, which may affect the mechanical strength and service life of welded points. In embodiments of the present disclosure, the anti-diffusion layer made of nickel is formed on the surface of the sub-ball metal electrode, which can act as a barrier layer between the sub-ball metal electrode and the solder ball to prevent the generation of intermetallic compounds and cavities. Further, the anti-diffusion layer is prone to be oxidized, thus, the wetting layer is formed on the anti-diffusion layer to prevent the oxidization of the anti-diffusion layer. The wetting layer may be infiltrated with the solder ball to be formed to lead to better adhesion. The wetting layer includes one selected from tin, gold and silver, or alloy of gold, cooper or silver. Therefore, the covering layer formed on the sub-ball metal electrode avoids the generation of intermetallic compounds, and improves the reliability of chip packaging. The second apron structure increases the contact area between the covering layer and the metal pad, and enhances the adhesion among the solder ball, the covering layer, the sub-ball metal electrode and the metal pad.

Although the present disclosure has been disclosed as above with reference to preferred embodiments thereof but will not be limited thereto. Those skilled in the art can modify and vary the embodiments without departing from the spirit and scope of the present disclosure. Accordingly, without departing from the scope of the present invented technology scheme, whatever simple modification and equivalent variation belong to the protection range of the present invented technology scheme.

What is claimed is:

1. A chip package structure, comprising:
   a semiconductor substrate;
   a metal pad inside the semiconductor substrate;
   an insulating layer on the semiconductor substrate, the insulating layer having an opening exposing a first surface of the metal pad;
   a sub-ball metal electrode on the first surface of the metal pad, wherein the sub-ball metal electrode partially covers the first surface;
   a solder ball encompassing the sub-ball metal electrode, wherein the solder ball comprises a first portion extending from the bottom part of the sub-ball metal electrode along directions substantially in parallel with the first surface, such that the first portion of the solder ball covers at least a part of the first surface which is not covered by the sub-ball metal electrode; and
   a covering layer disposed between the solder ball and the sub-ball metal electrode, and between the solder ball and the first surface of the metal pad, wherein the covering layer is a stacked structure comprising an anti-diffusion layer and a wetting layer, wherein the anti-diffusion layer is disposed on the surface of the sub-ball metal electrode and has a first apron structure, and the wetting layer is disposed on a surface of the anti-diffusion layer and has a second apron structure.

2. The chip package structure according to claim 1, wherein the projection of the first portion of the solder ball on the first surface is larger than the projection of the other portion of the solder ball on the first surface.

3. The chip package structure according to claim 1, wherein the metal pad is a redistributed pad.

4. The chip package structure according to claim 1, wherein from top to bottom, the profile curve of the solder ball comprises a convex segment and a concave segment.

5. The chip package structure according to claim 1, wherein the sub-ball metal electrode comprises a main body and an end portion, wherein the main body is a lower portion of the sub-ball metal electrode which is connected with the metal pad, and the end portion is an upper portion of the sub-ball metal electrode, wherein the projection of the main body on the first surface is larger than the projection of the end portion on the first surface.

6. The chip package structure according to claim 5, wherein the height of the end portion is 0.005 to 1.5 times to the height of the main body.

7. The chip package structure according to claim 1, wherein the anti-diffusion layer comprises nickel.

8. The chip package structure according to claim 1, wherein the wetting layer comprises one selected from tin, gold and silver, or alloy of tin, gold or silver.

9. A chip packaging method, comprising:
   providing a semiconductor substrate which has a metal pad formed therein and an insulating layer formed thereon, the insulating layer having an opening exposing a first surface of the metal pad;
   forming a sub-ball metal electrode on the first surface of the metal pad, wherein the sub-ball metal electrode partially covers the first surface;
   forming a solder ball encompassing the sub-ball metal electrode, wherein the solder ball comprises a first portion extending from the bottom part of the sub-ball metal electrode along directions substantially in parallel with the first surface, such that the first portion of the solder ball covers at least a part of the first surface which is not covered by the sub-ball metal electrode; and
   forming a covering layer between the solder ball and the sub-ball metal electrode, and between the solder ball and the first surface, wherein the covering layer is a stacked structure comprising an anti-diffusion layer and a wetting layer, wherein the anti-diffusion layer is disposed on the surface of the sub-ball metal electrode, and the wetting layer is disposed on a surface of the anti-diffusion layer.

10. The method according to claim 9, wherein the projection of the first portion of the solder ball on the first surface is larger than the projection of the other portion of the solder ball on the first surface.

11. The method according to claim 9, wherein the metal pad is a redistributed pad.

12. The method according to claim 9, wherein from top to bottom, the profile curve of the solder ball comprises a convex segment and a concave segment.

13. The method according to claim 9, wherein the sub-ball metal electrode comprises a main body and an end portion, wherein the main body is a lower portion of the sub-ball metal electrode which is connected with the metal pad, and the end portion is an upper portion of the sub-ball metal electrode, wherein the projection of the main body on the first surface is larger than the projection of the end portion on the first surface.

14. The method according to claim 13, wherein the sub-ball metal electrode is formed by a wire bonding process, the wire bonding process comprising:
   bonding a metal wire with the metal pad to form the main body;
   the metal wire generating an arc portion having a certain height to form the end portion; and
   cutting the metal wire using a clamp to form the sub-ball metal electrode.

15. The method according to claim 13, wherein the height of the end portion is 0.005 to 1.5 times to the height of the main body.

16. The method according to claim 9, wherein the anti-diffusion layer has a third first apron structure, and is formed by a chemical plating process.

* * * * *